(12) United States Patent
    Utsunomiya et al.

(10) Patent No.: US 10,140,580 B2
(45) Date of Patent: Nov. 27, 2018

(54) QUANTUM COMPUTING DEVICE FOR ISING MODEL, QUANTUM PARALLEL COMPUTING DEVICE FOR ISING MODEL, AND QUANTUM COMPUTING METHOD FOR ISING MODEL

(71) Applicants: Inter-University Research Institute Corporation, Research Organization of Information and Systems, Tachikawa-shi, Tokyo (JP); NIPPON TELEGRAPH AND TELEPHONE CORPORATION, Chiyoda-ku, Tokyo (JP)

(72) Inventors: Shoko Utsunomiya, Tokyo (JP); Yoshihisa Yamamoto, Tokyo (JP); Hiroki Takesue, Atsugi (JP)

(73) Assignees: Inter-University Research Institute Corporation, Research Organization of Information and Systems, Tokyo (JP); NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/302,951

(22) PCT Filed: Mar. 25, 2015

(86) PCT No.: PCT/JP2015/059057
§ 371 (c)(1),
(2) Date: Oct. 7, 2016

(87) PCT Pub. No.: WO2015/156126
PCT Pub. Date: Oct. 15, 2015

(65) Prior Publication Data
US 2017/0024658 A1    Jan. 26, 2017
US 2018/0268315 A2    Sep. 20, 2018

(30) Foreign Application Priority Data
Apr. 11, 2014  (JP) .................... 2014-082055

(51) Int. Cl.
*G06N 5/02* (2006.01)
*G06N 99/00* (2010.01)
(Continued)

(52) U.S. Cl.
CPC ............ *G06N 99/002* (2013.01); *B82Y 10/00* (2013.01); *G01R 33/0023* (2013.01);
(Continued)

(58) Field of Classification Search
None
See application file for complete search history.

(56) References Cited

U.S. PATENT DOCUMENTS

2014/0046626 A1* 2/2014 Yamamoto ........... G06N 99/002
                                                        702/151
2014/0200689 A1  7/2014 Utsunomiya et al.
2016/0162798 A1* 6/2016 Marandi .................. G02F 3/00
                                                        708/191

FOREIGN PATENT DOCUMENTS

JP      5354233 B2     9/2013
JP      2014-134710 A  7/2014
WO      2012/118064 A1 9/2012

OTHER PUBLICATIONS

Utsunomiya et al., Mapping of Ising models onto injection-locked laser systems, Optical Society of America, Aug. 31, 2011, 18 pages, vol. 19, No. 19.

(Continued)

*Primary Examiner* — J. H. Hur
(74) *Attorney, Agent, or Firm* — Ohlandt, Greeley, Ruggiero & Perle, L.L.P.

(57) ABSTRACT

A parametric oscillator oscillates a plurality of pseudo spin pulses SPi having mutually an identical oscillation fre-
(Continued)

quency by using parametric oscillation, an interaction implementing unit performs feedback implementation of a magnitude and a sign of interaction related to each pseudo spin pulse SPi (the proportionality coefficient $\lambda_i + \Sigma J_{ij}\sigma_j + \Sigma K_{ijk}\sigma_j\sigma_k$ with respect to $\sigma_i$) by using a tentative measurement result of oscillation phases $\phi_i$(tentative) of the plurality of pseudo spin pulses SPi, and a pseudo spin measuring unit measures the pseudo spins $\sigma_i$ of the plurality of pseudo spin pulses SPi, based on a final measurement result of oscillation phases $\phi_i$(steady) of the plurality of pseudo spin pulses SPi.

20 Claims, 21 Drawing Sheets

(51) Int. Cl.
| | | |
|---|---|---|
| *G01R 33/12* | (2006.01) | |
| *G01R 33/00* | (2006.01) | |
| *G06E 3/00* | (2006.01) | |
| *G02F 3/00* | (2006.01) | |
| *B82Y 10/00* | (2011.01) | |

(52) U.S. Cl.
CPC ........... *G01R 33/1284* (2013.01); *G02F 3/00* (2013.01); *G06E 3/005* (2013.01); *G06N 5/02* (2013.01)

(56) References Cited

OTHER PUBLICATIONS

Wang et al, Coherent Ising machine based on degenerate optical parametric oscillators, Physical Review, Dec. 30, 2013, 9 pages, A 88.
International Search Report dated Jun. 23, 2015 from corresponding PCT application No. PCT/JP2015/059057, 2 pages.
Written Opinion dated Jun. 23, 2015 from corresponding PCT application No. PCT/JP2015/059057, 3 pages.
International Preliminary Report on Patentability dated Oct. 12, 2016 from corresponding PCT application No. PCT/JP2015/059057, 4 pages.

\* cited by examiner

QUANTUM COMPUTING DEVICE FOR ISING MODEL, QUANTUM PARALLEL COMPUTING DEVICE FOR ISING MODEL, AND QUANTUM COMPUTING METHOD FOR ISING MODEL

BACKGROUND

1. Field of the Disclosure

The present disclosure provides a quantum computation device capable of easily solving the Ising model to easily solve an NP-complete problem or the like mapped into the Ising model.

2. Discussion of the Background Art

The Ising model has been researched originally as a model of a magnetic material but recently it is paid attention as a model mapped from an NP-complete problem or the like. However, it is very difficult to solve the Ising model when the number of sites is large. Thus, a quantum annealing machine and a quantum adiabatic machine in which the Ising model is implemented are proposed.

In the quantum annealing machine, after Ising interaction and Zeeman energy are physically implemented, the system is sufficiently cooled so as to realize a ground state, and the ground state is observed, whereby the Ising model is solved. However, in a case where the number of sites is large, the system is trapped into a metastable state in the process of being cooled, and the number of the metastable state exponentially increases with respect to the number of sites, whereby there is a problem in that the system is not easily relaxed from the metastable state to the ground state.

In the quantum adiabatic machine, transverse magnetic field Zeeman energy is physically implemented, and then the system is sufficiently cooled to realize the ground state of only the transverse magnetic field Zeeman energy. Then, the transverse magnetic field Zeeman energy is gradually lowered, Ising interaction is physically implemented slowly, the ground state of the system that includes the Ising interaction and vertical magnetic field Zeeman energy is realized, and ground state is observed, whereby the Ising model is solved. However, when the number of sites is large, there is a problem in that the speed of gradually lowering the transverse magnetic field Zeeman energy and physically implementing the Ising interaction needs to be exponentially decreased with respect to the number of sites.

In a case where the NP-complete problem or the like is mapped into an Ising model, and the Ising model is implemented as a physical spin system, there is a problem of a natural law that Ising interaction between sites that are physically located close to each other is large, and Ising interaction between sites that are physically located far from each other is small. The reason for this is that, in an artificial Ising model in which the NP-complete problem is mapped, there may be cases where Ising interaction between sites that are physically located close to each other is small, and Ising interaction between sites that are physically located far from each other is large. The difficult in mapping into a natural spin system also makes it difficult to easily solve the NP-complete problem or the like.

CITATION LIST

Patent Literature

Patent Literature 1: Japanese Patent No. 5354233

SUMMARY

A first conventional technology (see Patent Literature 1) and a second conventional technology for solving the above-described problems are described. An NP-complete problem can be substituted by an Ising model of a magnetic material, and the Ising model of a magnetic material can be substituted by a network of lasers.

Here, in the Ising model of a magnetic material, in a pair of atoms interacting with each other, the directions of spins tend to be oriented in opposite directions (in the case of interaction of antiferromagnetism) or in the identical direction (in the case of interaction of ferromagnetism) such that the energy of spin configuration is the lowest.

On the other hand, in a network of lasers, in a pair of lasers interacting with each other, the polarization (in the case of the first conventional technology) or the phases (in the case of the second conventional technology) of oscillation tend to be reverse rotations or opposite phases (in the case of interaction of antiferromagnetism), or the identical rotation or the identical phase (in the case of interaction of ferromagnetism) respectively such that the threshold gain of the oscillation mode is the lowest.

In other words, in a system configured by one pair of lasers, the polarization or the phases of oscillation can be optimized such that the threshold gain of the oscillation mode is the lowest. In a system configured by many pairs of lasers, when, in a case where the polarization or the phases of oscillation are optimized for a "certain" pair of lasers, the polarization or the phases of oscillation cannot be optimized for "other" pairs of lasers, a "point of compromise" of the polarization or the phases of oscillation as a "whole" of the network of lasers is searched for.

However, in a case where the polarization or the phases of oscillation are optimized as a whole of the network of lasers, it is necessary to achieve locking between lasers such that individual oscillation modes for each pair of lasers are not oscillated, but one oscillation mode is oscillated as a whole of the network of lasers.

As above, in the first conventional technology and the second conventional technology, each laser performs gradual increase control of pumping currents, one oscillation mode, whose threshold gain is the lowest, is oscillated as a whole of the network of lasers, and the polarization or the phases of oscillation of each laser are measured, whereby direction of a spin of each atom is measured. Accordingly, the problem of trapping into the metastable state in the quantum annealing machine and the problem of the implementation speed of Ising interaction in the quantum adiabatic machine can be solved.

Then, the first conventional technology and the second conventional technology, as described later using FIG. 1 and FIG. 2 respectively, can freely control not only the magnitude of Ising interaction between sites that are physically located close to each other but also the magnitude of Ising interaction between sites that are physically located far from each other. Accordingly, regardless of a physical distance between sites, an artificial Ising model mapped from an NP-complete problem or the like can be solved.

An outline of an Ising model quantum computation device of the first conventional technology is illustrated in FIG. 1. An outline of an Ising model quantum computation device of the second conventional technology is illustrated in FIG. 2.

Ising Hamiltonian is acquired using Numerical Expression 1.

$$H = \sum_{i,j=1}^{M} J_{ij}\sigma_i\sigma_j.  \qquad \text{[Numerical Expression 1]}$$

An Ising interaction implementing unit I12 controls amplitudes and phases of light exchanged between two surface emission lasers V1 and V2 to implement a magnitude and a sign of pseudo Ising interaction $J_{12}$ between the two surface emission lasers V1 and V2.

An Ising interaction implementing unit I13 controls amplitudes and phases of light exchanged between two surface emission lasers V1 and V3 to implement a magnitude and a sign of pseudo Ising interaction $J_{13}$ between the two surface emission lasers V1 and V3.

An Ising interaction implementing unit I14 controls amplitudes and phases of light exchanged between two surface emission lasers V1 and V4 to implement a magnitude and a sign of pseudo Ising interaction $J_{14}$ between the two surface emission lasers V1 and V4.

An Ising interaction implementing unit I23 controls amplitudes and phases of light exchanged between the two surface emission lasers V2 and V3 to implement a magnitude and a sign of pseudo Ising interaction $J_{23}$ between the two surface emission lasers V2 and V3.

An Ising interaction implementing unit I24 controls amplitudes and phases of light exchanged between the two surface emission lasers V2 and V4 to implement a magnitude and a sign of pseudo Ising interaction $J_{24}$ between the two surface emission lasers V2 and V4.

An Ising interaction implementing unit I34 controls amplitudes and phases of light exchanged between the two surface emission lasers V3 and V4 to implement a magnitude and a sign of pseudo Ising interaction $J_{34}$ between the two surface emission lasers V3 and V4.

A master laser M performs injection locking for the surface emission lasers V1 to V4 to align oscillation frequencies of the surface emission lasers V1 to V4 in the identical frequency. Locking between the surface emission lasers V1 to V4 is achieved to ensure oscillation of one oscillation mode as a whole network of the surface emission lasers V1 to V4 in optimizing the polarization or the phases of oscillation as the whole of the network of the surface emission lasers V1 to V4.

In the first conventional technology, after the surface emission lasers V1 to V4 arrive at a steady state in the process of exchanging the light, an Ising spin measuring unit (not illustrated) measures left-handed/right-handed circular polarization of oscillation of the surface emission lasers V1 to V4, whereby measuring upward/downward pseudo Ising spins $\sigma_1$ to $\sigma_4$ of the surface emission lasers V1 to V4.

However, the surface emission laser V has in-plane anisotropy, and accordingly, it is difficult to oscillate left-handed/right-handed circular polarization in the identical frequency and the identical threshold gain. Accordingly, a certain surface emission laser V, as a single laser, may easily oscillate the light having left-handed (or right-handed) circular polarization compared with oscillating the light having right-handed (or left-handed) circular polarization. Then, this surface emission laser V, as a whole of the network of lasers, may causes the incorrect answer that oscillates the light having left-handed (or right-handed) circular polarization, whereas the correct answer is to oscillate the light having right-handed (or left-handed) circular polarization.

In the second conventional technology, after the surface emission lasers V1 to V4 arrive at a steady state in the process of exchanging the light, an Ising spin measuring unit (not illustrated) measures lead/lag of the phases of linear polarization of oscillation of the surface emission lasers V1 to V4, whereby measuring upward/downward pseudo Ising spins $\sigma_1$ to $\sigma_4$ of the surface emission lasers V1 to V4.

Here, the left-handed/right-handed circular polarization is made by superposing horizontal polarization and vertical polarization in the identical weight with the phase difference ±π/2. In other words, measuring lead/lag of the phases of the vertical polarization can obtain information of upward/downward Ising spins without measuring left-handed/right-handed circular polarization and without measuring the horizontal polarization. Accordingly, the in-plane anisotropy problem of the surface emission laser V in the first conventional technology can be solved.

The principle of the Ising model quantum computation device of the second conventional technology is illustrated in FIG. 3. The oscillation phase 0 of the linear polarization of the master laser M does not change from the initial state to a steady state. The oscillation phase ϕ(t) of the linear polarization of each surface emission laser V is expected to be zero identical to the oscillation phase 0 of the linear polarization of the master laser M in the initial state, and ±π/2 deviated from the oscillation phase 0 of the linear polarization of the master laser M in the steady state. ϕ(steady)=±π/2 in the steady state is associated with σ=±1 (double signs in the identical order).

For each pair of surface emission lasers V, when the Ising interaction $J_{ij}$ is positive, it is advantageous from the viewpoint of energy that the pseudo spins σ of the two surface emission lasers V have mutually different signs. Accordingly, each Ising interaction implementing unit tends to oscillate easily an oscillation mode, in which the oscillation phases ϕ (steady) of the two surface emission lasers V have mutually-different signs and have a deviation of π therebetween.

For each pair of surface emission lasers V, when the Ising interaction $J_{ij}$ is negative, it is advantageous from the viewpoint of energy that the pseudo spins σ of the two surface emission lasers V have mutually the identical sign. Accordingly, each Ising interaction implementing unit tends to oscillate easily an oscillation mode, in which the oscillation phases ϕ(steady) of the two surface emission lasers V have the identical sign and have a deviation of zero therebetween.

Above all, in the whole Ising model quantum computation device, one oscillation mode is configured to be integrally oscillated. Thus, in each pair of surface emission lasers V, there is a case where the above-described oscillation mode is actually oscillated, and there is also a case where the above-described oscillation mode is not necessarily oscillated.

Now, the oscillation phase ϕ (t) of the linear polarization of each surface emission laser V is ideally preferred to be zero identical to the oscillation phase 0 of the linear polarization of the master laser M in the initial state. However, in practice, the oscillation phase ϕ (t) of the linear polarization of each surface emission laser V is slightly deviated from the oscillation phase 0 of the linear polarization of the master laser M.

The oscillation phase ϕ (t =0) in the initial state of the linear polarization of each surface emission laser V is represented as in Numerical Expression 2 by using a free-running frequency ω of each surface emission laser V, and an oscillation frequency ω0 of the master laser M and an injection locking width $\Delta_{\omega L}$ (the injection locking can be achieved how ω is close to ω0).

$$\sin\phi(t=0) = \frac{\omega_0 - \omega}{\Delta\omega_L}. \quad \text{[Numerical Expression 2]}$$

In other words, when the free-running frequency ω of each surface emission laser V can be aligned with the oscillation frequency $ω_0$ of the master laser M, the oscillation phase φ(t=0) in the initial state of the linear polarization of each surface emission laser V is zero identical to the oscillation phase 0 of the linear polarization of the master laser M. However, it is difficult to align the free-running frequency ω of each surface emission laser V with the oscillation frequency $ω_0$ of the master laser M, whereby the oscillation phase φ (t=0) in the initial state of the linear polarization of each surface emission laser V slightly deviates from the oscillation phase 0 of the linear polarization of the master laser M.

Accordingly, a certain surface emission laser V, as a single laser, may easily oscillate the light having the oscillation phase that leads (or lags) from the oscillation phase 0 of the linear polarization of the master laser M compared with oscillating the light having the oscillation phase that lags (or leads) from the oscillation phase 0 of the linear polarization of the master laser M. Then, this surface emission laser V, as a whole of the network of lasers, may causes the incorrect answer that oscillates the light having the oscillation phase that leads (or lags) from the oscillation phase 0 of the linear polarization of the master laser M, whereas the correct answer is to oscillate the light having the oscillation phase that lags (or leads) from the oscillation phase 0 of the linear polarization of the master laser M.

In FIG. 2, when the number of Ising sites is M, the M surface emission lasers V are required, and the M(M−1)/2 Ising interaction implementing units are required. Then, when the number of Ising sites is large, the Ising model quantum computation device becomes large and complicated.

Therefore, in order to solve the above-described problems, the object of the present disclosure is to prevent reading error and to simplify the circuit configuration in the Ising model quantum computation device.

In order to achieve the above-described object, a plurality of pseudo spin pulses having mutually the identical oscillation frequency are oscillated by using parametric oscillation, then feedback implementation of the magnitude and the sign of the interaction related to each pseudo spin pulse is performed by using a tentative measurement result of the oscillation phases of the plurality of pseudo spin pulses, and then pseudo spins of the plurality of pseudo spin pulses are measured based on a final measurement result of the oscillation phases of the plurality of pseudo spin pulses.

More specifically, the present disclosure is an Ising model quantum computation device that includes: a parametric oscillator that parametrically oscillates a plurality of pseudo spin pulses in correspondence with a plurality of Ising model spins in a pseudo manner and having mutually an identical oscillation frequency; a ring resonator in which the plurality of pseudo spin pulses circularly propagate; a tentative spin measuring unit that tentatively measures phases of the plurality of pseudo spin pulses every time the plurality of pseudo spin pulses circularly propagate in the ring resonator to tentatively measure pseudo spins of the plurality of pseudo spin pulses; an interaction computing unit that tentatively computes interaction related to a certain pseudo spin pulse based on a coupling coefficient of the Ising model related to the certain pseudo spin pulse and a pseudo spin of other pseudo spin pulse having been tentatively measured by the tentative spin measuring unit; an interaction implementing unit that controls amplitudes and phases of light injected to the certain pseudo spin pulse to tentatively implement a magnitude and a sign of the interaction related to the certain pseudo spin pulse having been tentatively computed by the interaction computing unit; and a pseudo spin measuring unit that measures the phases of the plurality of pseudo spin pulses after the plurality of pseudo spin pulses have arrived at a steady state in a process of repeating a feedback loop configured of the tentative spin measuring unit, the interaction computing unit, and the interaction implementing unit to measure the pseudo spins of the plurality of pseudo spin pulses.

According to this configuration, since the plurality of pseudo spin pulses have mutually the identical oscillation frequency, it is not possible that the oscillation phases in the initial state of respective pseudo spin pulses are close to one phase and far from the other phase of two kinds of oscillation phases in the steady state of the respective pseudo spin pulses. Accordingly, in the Ising model quantum computation device, the reading error can be prevented.

Then, when the number of Ising sites is M, M surface emission lasers are required in the first and second conventional technologies, while it is enough to prepare only one parametric oscillator in the present disclosure. Furthermore, when the number of Ising sites is M, M(M−1)/2 Ising interaction implementing units are required in the first and second conventional technologies, while it is enough to prepare only one system feedback loop in the present disclosure. Accordingly, in the Ising model quantum computation device, the circuit configuration can be simplified.

In the present disclosure, the interaction computing unit tentatively computes interaction of three or more bodies related to the certain pseudo spin pulse based on a coupling coefficient of three or more bodies of the Ising model related to the certain pseudo spin pulse and the pseudo spin of the other pseudo spin pulse having been tentatively measured by the tentative spin measuring unit, and the interaction implementing unit controls the amplitudes and the phases of light injected to the certain pseudo spin pulse to tentatively implement a magnitude and a sign of the interaction of three or more bodies related to the certain pseudo spin pulse having been tentatively computed by the interaction computing unit.

According to this configuration, the interaction of three or more bodies of the Ising model can be implemented in a range of linear superposition of each pseudo spin pulse and each injected light pulse.

In the present disclosure, the parametric oscillator parametrically oscillates a plurality of local oscillation pulses having an oscillation frequencies identical to the oscillation frequencies of the plurality of pseudo spin pulses, the plurality of local oscillation pulses pair with the plurality of pseudo spin pulses one-on-one, the ring resonator in which the plurality of local oscillation pulses circularly propagate, the Ising model quantum computation device further includes a pulse-phase equalizing unit that equalizes phases of the plurality of local oscillation pulses from a state including both positive phases and negative phases to a state including one of positive phases and negative phases, the tentative spin measuring unit performs homodyne detection for a part of the plurality of pseudo spin pulses by using a part of the plurality of local oscillation pulses that pair with the plurality of pseudo spin pulses one-on-one, the interaction implementing unit injects local oscillation pulses that pair with the certain pseudo spin pulses one-on-one and the part of which have the controlled amplitudes and phases, to the certain pseudo spin pulses, and the pseudo spin measuring unit performs homodyne detection for a part of the plurality of pseudo spin pulses by using a part of the plurality of local oscillation pulses that pair with the plurality of pseudo spin pulses one-on-one.

According to this configuration, feedback implementation of the magnitude and the sign of the interaction related to each pseudo spin pulse, based on the tentative measurement result of the oscillation phases of the plurality of pseudo spin pulses, can be performed by using a specific configuration. Then, according to this configuration, compared with the following configuration, since the pseudo spin pulses and the local oscillation pulses are paired to circularly propagate in the ring resonator, a problem of fluctuation of optical path length from the pulse generator to the spin measuring unit can be solved. Accordingly, in the Ising model quantum computation device, the reading error can be prevented.

In the present disclosure, the Ising model quantum computation device further includes: a pulse generator that generates a local oscillation pulse having an angular frequency $\omega$; and a second harmonic generator that generates a pulse having an angular frequency $2\omega$ by using the local oscillation pulse having the angular frequency $\omega$, the parametric oscillator parametrically oscillates the plurality of pseudo spin pulses by using the pulse having the angular frequency $2\omega$, the tentative spin measuring unit performs homodyne detection for a part of the plurality of pseudo spin pulses by using the local oscillation pulse having the angular frequency $\omega$, the interaction implementing unit injects the local oscillation pulse having the angular frequency $\omega$ with a controlled amplitude and phase, to the certain pseudo spin pulse, and the pseudo spin measuring unit performs homodyne detection for a part of the plurality of pseudo spin pulses by using the local oscillation pulse having the angular frequency $\omega$.

According to this configuration, feedback implementation of the magnitude and the sign of the interaction related to each pseudo spin pulse, based on the tentative measurement result of the oscillation phases of the plurality of pseudo spin pulses can be performed by using a specific configuration. Then, according to this configuration, compared with the above-described configuration, since the pseudo spin pulses and the local oscillation pulses are not paired to circularly propagate in the ring resonator, crosstalk between the pseudo spin pulses and the local oscillation pulses can be removed, whereby ensuring removing of the pulse-phase equalizing unit that equalizes all the local oscillation pulses. Accordingly, in the Ising model quantum computation device, the reading error can be prevented.

In the present disclosure, the interaction implementing unit controls the amplitude of light injected to the certain pseudo spin pulse larger at an initial stage of a computation process and smaller at a terminal stage of the computation process.

According to this configuration, at the initial stage of the computation process, it is possible to make the reading result of each pseudo spin pulse as a correct answer as possible. Even when the reading result of the certain pseudo spin pulse is not the correct answer at the initial stage of the computation process, if a correct answer for other pseudo spin pulse is fed back, a correct answer for all the pseudo spin pulses can be obtained at the terminal stage of the computation process. Accordingly, in the Ising model quantum computation device, the reading error can be prevented.

In the present disclosure, the Ising model quantum computation device further includes a tentative amplitude measuring unit that tentatively measures amplitudes of the plurality of pseudo spin pulses every time the plurality of pseudo spin pulses circularly propagate in the ring resonator, the parametric oscillator performs feedback control for amplitude of a pump pulse used for parametric oscillation such that the amplitudes of the plurality of pseudo spin pulses become equal based on the amplitudes of the plurality of pseudo spin pulses having been measured by the tentative amplitude measuring unit.

According to this configuration, a problem of substantive rewriting of the Ising model coupling coefficient by lack of balance of the amplitude of each pseudo spin pulse can be removed. Accordingly, in the Ising model quantum computation device, the reading error can be prevented.

In the present disclosure, the Ising model quantum parallel computation device includes n-th Ising model quantum computation device as described above where n-th group (n is an integer equal to or more than one) of pseudo spin pulses in correspondence with n-th group of spins in a pseudo manner among the plurality of Ising model spins circularly propagate in the ring resonator; and a tentative spin sharing unit that shares information of pseudo spins of the n-th group of pseudo spin pulses among the Ising model quantum computation devices included in parallel. The n-th group of pseudo spin pulses has been tentatively measured by the tentative spin measuring unit in the n-th Ising model quantum computation device.

According to this configuration, even when the number of the Ising model sites is large, the plurality of Ising model quantum computation devices perform a parallel dispersion process, whereby ensuring the reduction of computation processing burden of each Ising model quantum computation device.

The present disclosure is an Ising model quantum computation method that includes: a parametric oscillating step of parametrically oscillating a plurality of pseudo spin pulses in correspondence with a plurality of Ising model spins in a pseudo manner and having mutually an identical oscillation frequency; a tentative spin measuring step of tentatively measuring phases of the plurality of pseudo spin pulses every time the plurality of pseudo spin pulses circularly propagate in a ring resonator to tentatively measure pseudo spins of the plurality of pseudo spin pulses; an interaction computing step of tentatively computing interaction related to a certain pseudo spin pulse based on a coupling coefficient of the Ising model related to the certain pseudo spin pulse and a pseudo spin of other pseudo spin pulse having been tentatively measured by the tentative spin measuring step every time the plurality of pseudo spin pulses circularly propagate in the ring resonator; an interaction implementing step of controlling an amplitude and a phase of light injected to the certain pseudo spin pulse every time the plurality of pseudo spin pulses circularly propagate in the ring resonator to tentatively implement a magnitude and a sign of the interaction related to the certain pseudo spin pulse having been tentatively computed by the interaction computing step; a parametric amplifying step of parametrically amplifying the plurality of pseudo spin pulses every time the plurality of pseudo spin pulses circularly propagate in the ring resonator; and a pseudo spin measuring step of measuring the phases of the plurality of pseudo spin pulses after the plurality of pseudo spin pulses have arrived at a steady state in a process of repeating a feedback loop including the tentative spin measuring step, the interaction implementing step, and the parametric amplifying step in this order to measure the pseudo spins of the plurality of pseudo spin pulses.

According to this configuration, since between the tentative spin measuring step and the interaction implementing step, the parametric amplifying step does not enter, whereby the time lag hardly occurring, the interaction that has little delay between the Ising model sites can be implemented.

The present disclosure is an Ising model quantum computation method that includes: a parametric oscillating step of parametrically oscillating a plurality of pseudo spin pulses in correspondence with a plurality of Ising model spins in a pseudo manner and having mutually an identical oscillation frequency; a tentative spin measuring step of tentatively measuring phases of the plurality of pseudo spin pulses every time the plurality of pseudo spin pulses circularly propagate in a ring resonator to tentatively measure pseudo spins of the plurality of pseudo spin pulses; an interaction computing step of tentatively computing interaction related to a certain pseudo spin pulse based on a coupling coefficient of the Ising model related to the certain pseudo spin pulse and a pseudo spin of other pseudo spin pulse having been tentatively measured by the tentative spin measuring step every time the plurality of pseudo spin pulses circularly propagate in the ring resonator; a parametric amplifying step of parametrically amplifying the plurality of pseudo spin pulses every time the plurality of pseudo spin pulses circularly propagate in the ring resonator; an interaction implementing step of controlling an amplitude and a phase of light injected to the certain pseudo spin pulse every time the plurality of pseudo spin pulses circularly propagate in the ring resonator to tentatively implement a magnitude and a sign of the interaction related to the certain pseudo spin pulse having been tentatively computed by the interaction computing step; and a pseudo spin measuring step of measuring the phases of the plurality of pseudo spin pulses after the plurality of pseudo spin pulses have arrived at a steady state in a process of repeating a feedback loop including the tentative spin measuring step, the parametric amplifying step, and the interaction implementing step in this order to measure the pseudo spins of the plurality of pseudo spin pulses.

According to this configuration, between the tentative spin measuring step and the interaction implementing step, the parametric amplifying step enters, whereby the time lag being generated to some extent, however the interaction that has practically no delay between the Ising model sites can be implemented.

EFFECT OF THE INVENTION

The present disclosure can prevent the reading error and simplify the circuit configuration in the Ising model quantum computation device.

DETAILED DESCRIPTION OF THE PREFERRED EMBODIMENT

Figure 1:
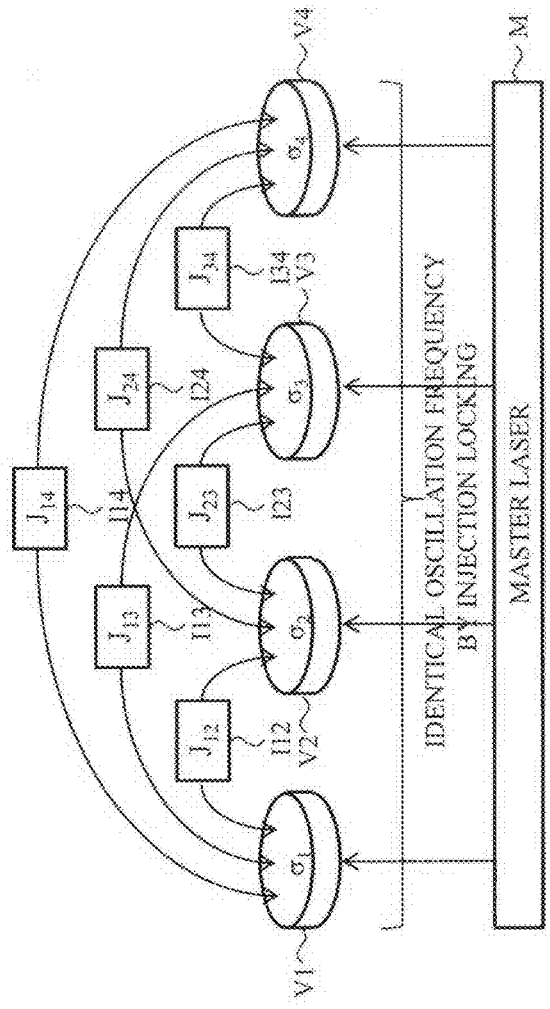
FIG. 1 is a diagram that illustrates an outline of an Ising model quantum computation device of a first conventional technology.
Figure 2:
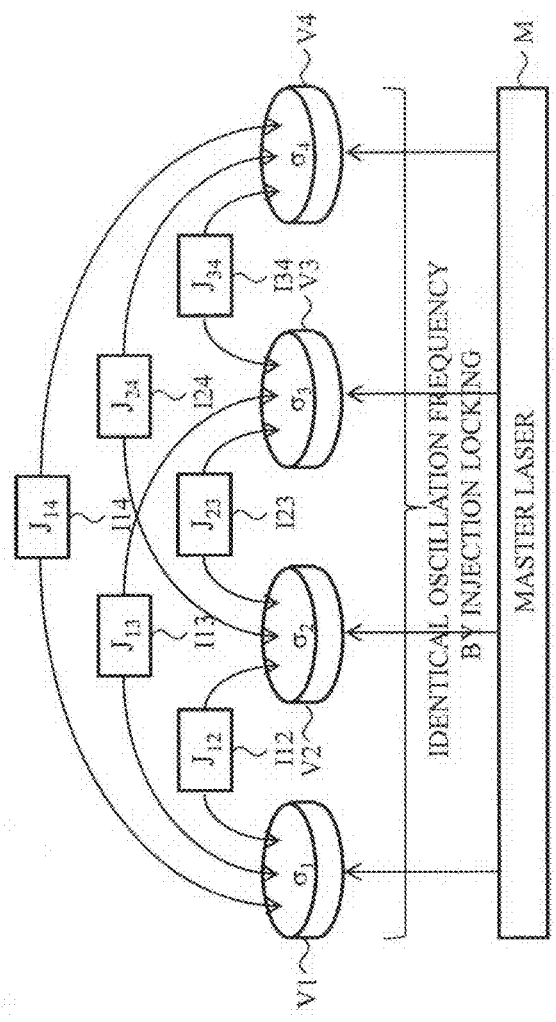
FIG. 2 is a diagram that illustrates an outline of an Ising model quantum computation device of a second conventional technology.
Figure 3:
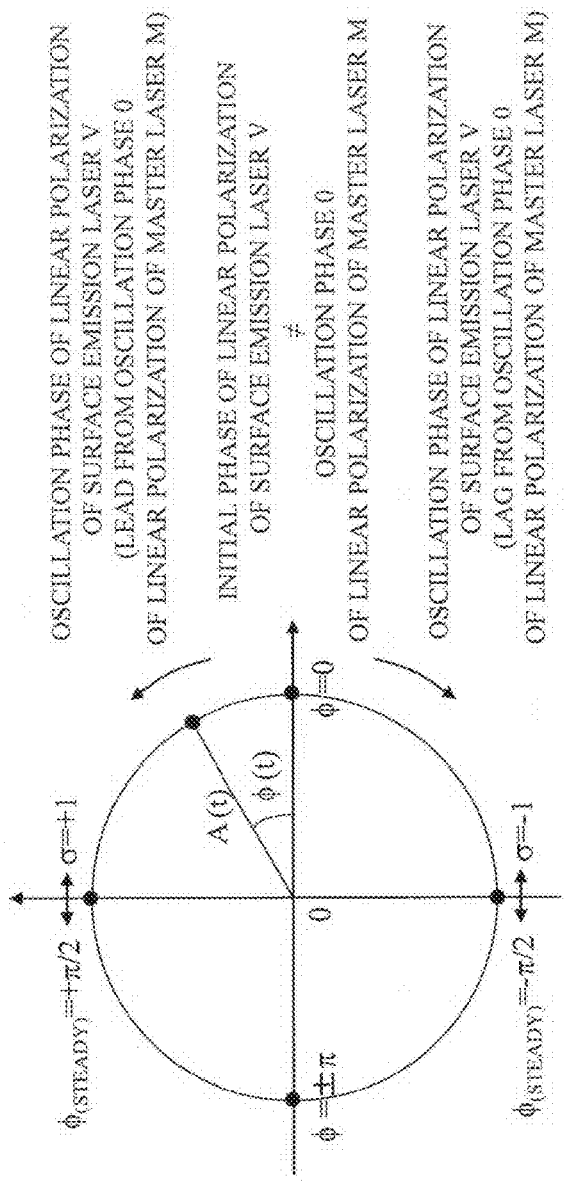
FIG. 3 is a diagram that illustrates a principle of the Ising model quantum computation device of the second conventional technology.

Embodiments of the present disclosure will be described with reference to the accompanying drawings. The embodiments to be described hereinafter are examples of embodiments of the present disclosure, and the present disclosure is not limited to the following embodiments. In this specification and the drawings, like reference numerals denote like elements.

(Configuration and Principle of Ising Quantum Computation Device of Present Disclosure)

Figure 4:
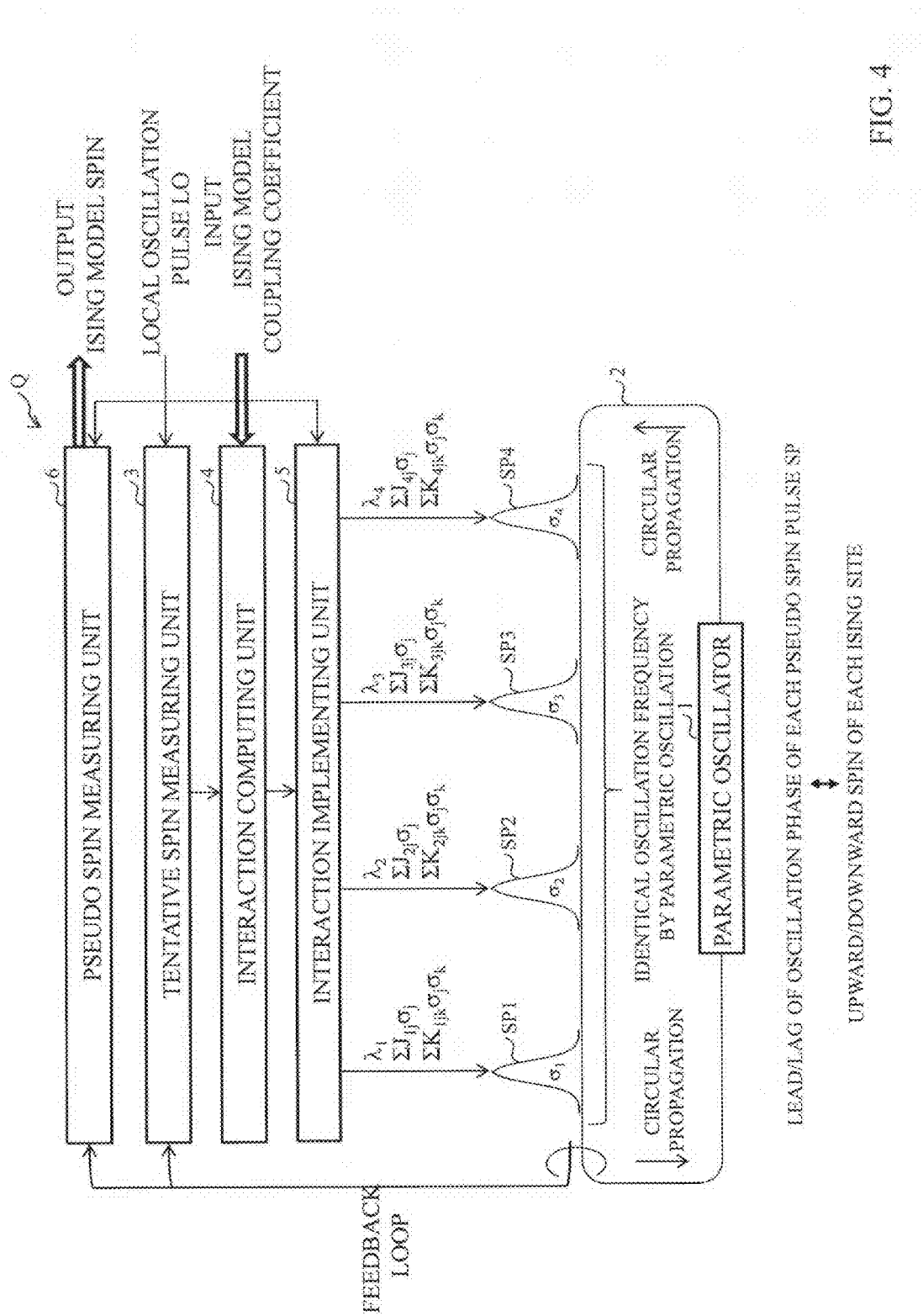
FIG. 4 is a diagram that illustrates a configuration of an Ising model quantum computation device of the present disclosure.

A configuration of an Ising model quantum computation device Q of the present disclosure is illustrated in FIG. 4. In the present disclosure, Ising Hamiltonian is acquired using Numerical Expression 3 as including interaction of one to three bodies.

$$H = \sum_{i=1}^{M} \lambda_i \sigma_i + \sum_{i,j=1}^{M} J_{ij}\sigma_i\sigma_j + \sum_{i,j,k=1}^{M} K_{ijk}\sigma_i\sigma_j\sigma_k.$$ [Numerical Expression 3]

A parametric oscillator 1 parametrically oscillates a plurality of pseudo spin pulses SP1 to SP4 that are in correspondence with a plurality of Ising model spins $\sigma_1$ to $\sigma_4$ in a pseudo manner and have mutually an identical oscillation frequency. A ring resonator 2 circularly propagates the plurality of pseudo spin pulses SP1 to SP4. The plurality of pseudo spin pulses SP1 to SP4 enter a feedback loop to be described later in the following order; SP1, SP2, SP3, SP4, SP1, SP2, SP3, SP4, . . . .

A tentative spin measuring unit 3 tentatively measures phases of the plurality of pseudo spin pulses SP1 to SP4, every time the plurality of pseudo spin pulses SP1 to SP4 circularly propagate in the ring resonator 2, to tentatively measure the pseudo spins $\sigma_1$ to $\sigma_4$ of the plurality of pseudo spin pulses SP1 to SP4. More specifically, the tentative spin measuring unit 3 performs homodyne detection by using a local oscillation pulse LO described later by using FIG. 6 and FIG. 7.

An interaction computing unit 4 tentatively computes interaction related to a certain pseudo spin pulse SPi (a proportionality coefficient $\lambda_i + \Sigma J_{ij}\sigma_j + \Sigma K_{ijk}\sigma_j\sigma_k$ with respect to $\sigma_i$), based on Ising model coupling coefficients $\lambda_i$, $J_{ij}$, and $K_{ijk}$ related to the certain pseudo spin pulse SPi, and pseudo spins $\sigma_j$ and $\sigma_k$ of other pseudo spin pulses SPj and SPk respectively that the tentative spin measuring unit 3 has tentatively measured. FIG. 4 illustrates a case where i, j, and k=1 to 4.

Here, after an NP-complete problem or the like is mapped into the Ising model, the interaction computing unit 4 inputs the Ising model coupling coefficients $\lambda_i$, $J_{ij}$, and $K_{ijk}$.

An interaction implementing unit 5 controls amplitudes and phases of light injected to the certain pseudo spin pulse SPi to tentatively implement a magnitude and a sign of the interaction related to the certain pseudo spin pulse SPi (the proportionality coefficient $\lambda_i + \Sigma J_{ij}\sigma_j + \Sigma K_{ijk}\sigma_j\sigma_k$ with respect to $\sigma_i$) that the interaction computing unit 4 has tentatively computed. More specifically, the interaction implementing unit 5 generates injection light pulses by using the local oscillation pulse LO described later by using FIG. 6 and FIG. 7.

A pseudo spin measuring unit 6 measures the phases of the plurality of pseudo spin pulses SP1 to SP4 after the plurality of pseudo spin pulses SP1 to SP4 have arrived at a steady state in a process of repeating a feedback loop configured of the tentative spin measuring unit 3, the interaction computing unit 4, and the interaction implementing unit 5, to measure the pseudo spins $\sigma_1$ to $\sigma_4$ of the plurality of pseudo spin pulses SP1 to SP4. More specifically, the pseudo spin measuring unit 6 performs homodyne detection by using the local oscillation pulse LO described later by using FIG. 6 and FIG. 7.

Here, after the pseudo spin measuring unit 6 outputs the Ising model spins $\sigma_1$ to $\sigma_4$, the Ising model is demapped into the NP-complete problem or the like.

As above, gradual increase control of pumping currents is performed in the parametric oscillator 1, one oscillation mode, whose threshold gain is the lowest, is oscillated as a whole of a network of the plurality of pseudo spin pulses SP1 to SP4, and oscillation phases of the plurality of pseudo spin pulses SP1 to SP4 are measured, whereby measuring the direction of spin of each atom in correspondence with each of the plurality of pseudo spin pulses SP1 to SP4.

Figure 5:
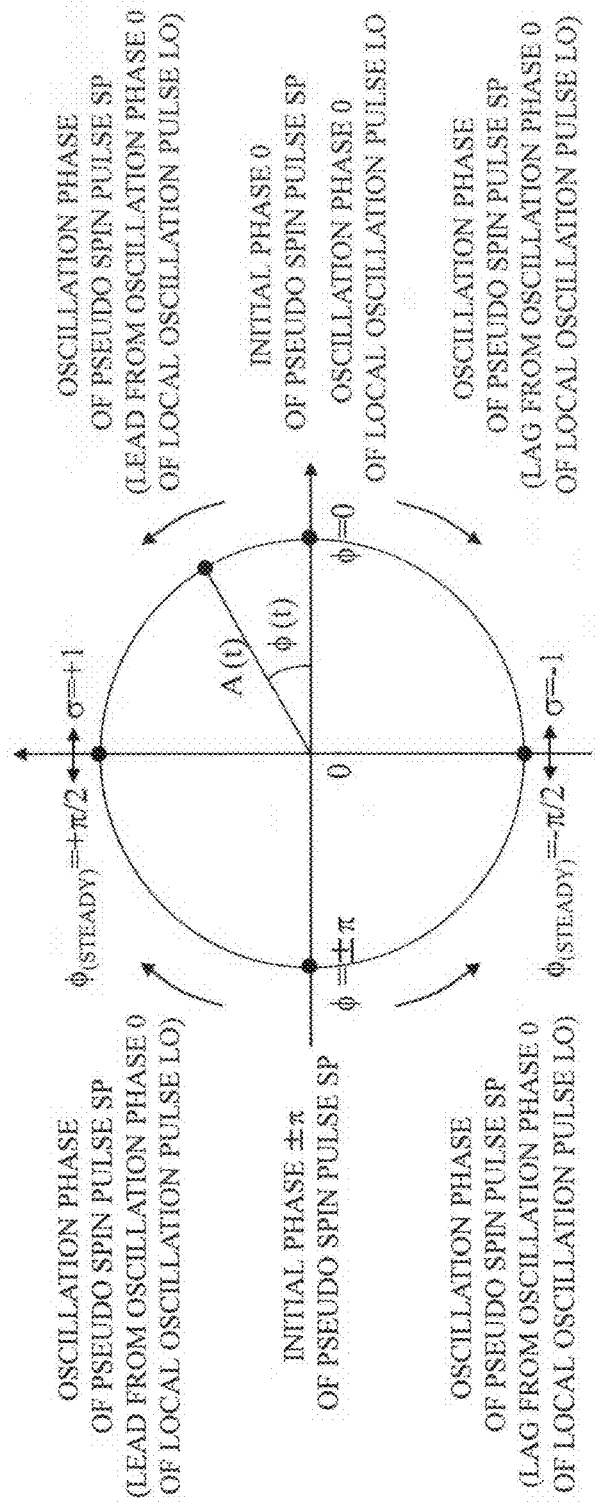
FIG. 5 is a diagram that illustrates a principle of the Ising model quantum computation device of the present disclosure.

A principle of the Ising model quantum computation device Q of the present disclosure is illustrated in FIG. 5. An oscillation phase 0 of the local oscillation pulse LO does not change from an initial state to the steady state. An oscillation phase φ (t) of each pseudo spin pulse SP is zero or ±π in the initial state (each pseudo spin pulse SP is parametrically oscillated by the parametric oscillator 1, and then each pseudo spin pulse SP is in a squeezed state.), and ±π/2 deviated from the oscillation phase 0 or ±π in the initial state, in the steady state. φ (steady)=±π/2 in the steady state is associated with to $\sigma=\pm 1$ (double signs in the identical order).

For each pseudo spin pulse SP, when the coupling coefficient $\lambda_i$ of the interaction of one body is positive, it is advantageous from the viewpoint of energy that the pseudo spin $\sigma$ of this pseudo spin pulse SP is −1. Accordingly, the interaction implementing unit 5 tends to oscillate easily an oscillation mode, in which the oscillation phase φ (steady) of this pseudo spin pulse SP is −π/2.

For each pseudo spin pulse SP, when the coupling coefficient $\lambda_i$ of the interaction of one body is negative, it is advantageous from the viewpoint of energy that the pseudo spin $\sigma$ of this pseudo spin pulse SP is +1. Accordingly, the interaction implementing unit 5 tends to oscillate easily an oscillation mode, in which the oscillation phase φ (steady) of this pseudo spin pulse SP is +π/2.

For two pseudo spin pulses SP, when the coupling coefficient $J_{ij}$ of the interaction of two bodies is positive, it is advantageous from the viewpoint of energy that the pseudo spins $\sigma$ of the two pseudo spin pulses SP have mutually different signs. Accordingly, the interaction implementing unit 5 tends to oscillate easily an oscillation mode, in which the oscillation phases φ (steady) of the two pseudo spin pulses SP have mutually different signs.

For two pseudo spin pulses SP, when the coupling coefficient $J_{ij}$ of the interaction of two bodies is negative, it is advantageous from the viewpoint of energy that the pseudo spins $\sigma$ of the two pseudo spin pulses SP have mutually an identical sign. Accordingly, the interaction implementing unit 5 tends to oscillate easily an oscillation mode, in which the oscillation phases φ(steady) of the two pseudo spin pulses SP have mutually the identical sign.

For three pseudo spin pulses SP, when the coupling coefficient $K_{ijk}$ of the interaction of three bodies is positive, it is advantageous from the viewpoint of energy that (1) the pseudo spins $\sigma$ of the three pseudo spin pulses SP are −1, or (2) the pseudo spins $\sigma$ of the two pseudo spin pulses SP are +1, and the pseudo spin $\sigma$ of the one pseudo spin pulse SP is −1. Accordingly, the interaction implementing unit 5 tends to oscillate easily an oscillation mode, in which (1) the oscillation phases φ (steady) of the three pseudo spin pulses SP are −π/2, or (2) the oscillation phases φ (steady) of the two pseudo spin pulses SP are +π/2, and the oscillation phase φ (steady) of the one pseudo spin pulse SP is −π/2.

For three pseudo spin pulses SP, when the coupling coefficient $K_{ijk}$ of the interaction of three bodies is negative, it is advantageous from the viewpoint of energy that (1) the pseudo spins $\sigma$ of the three pseudo spin pulses SP are +1, or (2) the pseudo spins $\sigma$ of the two pseudo spin pulses SP are −1, and the pseudo spin $\sigma$ of the one pseudo spin pulse SP is +1. Accordingly, the interaction implementing unit 5 tends to oscillate easily an oscillation mode, in which (1) the oscillation phases φ (steady) of the three pseudo spin pulses SP are +π/2, or (2) the oscillation phases φ (steady) of the two pseudo spin pulses SP are $-\pi/2$, and the oscillation phase $\phi$ (steady) of the one pseudo spin pulse SP is $+\pi/2$.

Above all, in the whole Ising model quantum computation device Q, one oscillation mode is configured to be integrally oscillated. Thus, in each pseudo spin pulse SP, there is a case where the above-described oscillation mode is actually oscillated, and there is also a case where the above-described oscillation mode is not necessarily oscillated.

The computational principle illustrated in FIG. 4 and FIG. 5 is described in detail. In each one of the pseudo spin pulses SP1, SP2, SP3, and SP4, rate equations for oscillation intensity $A_i(t)$, an oscillation phase $\phi_i(t)$, and an inverted population number difference of carriers $N_{Ci}(t)$ are as in Numerical Expressions 4 to 7.

$$\frac{d}{dt}A_i(t) = \qquad \text{[Numerical Expression 4]}$$
$$-\frac{1}{2}\left\{\frac{\omega}{Q} - E_{Ci}(t)\right\}A_i(t) + \frac{\omega}{Q}A(-\lambda_i \sin\phi_i(t)) -$$
$$\frac{\omega}{Q}\sum_{j\neq i}^{M} \frac{1}{2}J_{ij}A\cos\{\phi_j(t) - \phi_i(t)\} -$$
$$\frac{\omega}{Q}\sum_{j,k\neq i}^{M} \frac{1}{2}K_{ijk}A\cos\{\phi_{jk}(t) - \phi_i(t)\} + F_A$$

$$\frac{d}{dt}\phi_i(t) = \frac{1}{A_i(t)}\left[\frac{\omega}{Q}A\{-\lambda_i\cos\phi_i(t)\} - \right. \qquad \text{[Numerical Expression 5]}$$
$$\frac{\omega}{Q}\sum_{j\neq i}^{M} \frac{1}{2}J_{ij}A\sin\{\phi_j(t) - \phi_i(t)\} -$$
$$\left.\frac{\omega}{Q}\sum_{j,k\neq i}^{M} \frac{1}{2}K_{ijk}A\sin\{\phi_{jk}(t) - \phi_i(t)\}\right] + F_\phi$$

$$\frac{d}{dt}N_{Ci}(t) = P - \frac{N_{Ci}(t)}{\tau_{sp}} - E_{Ci}(t)\{A_i^2(t) + 1\} + F_N \qquad \text{[Numerical Expression 6]}$$

$$E_{Ci}(t) = \beta\frac{N_{Ci}(t)}{\tau_{sp}} \qquad \text{[Numerical Expression 7]}$$

Here, $\omega$ is an oscillation frequency, and Q is a Q factor of resonator of each pseudo spin pulse SP. P is the number of electrons injected to each pseudo spin pulse SP per second for realizing inverted population, in other words, the pumping rate. $-(1/2)(\omega/Q)A_i(t)$ illustrated in Numerical Expression 4 represents the decreasing rate of the oscillation intensity $A_i(t)$ according to elapse of time that is caused by a resonator loss.

$\tau_{sp}$ is an electron lifetime according to spontaneous emission toward oscillation modes other than a laser oscillation mode. $\beta$ is a coupling constant of all the light that is spontaneously emitted to the laser oscillation mode. $(1/2)E_{Ci}(t)A_i(t)$ illustrated in Numerical Expression 4 represents the increasing rate of the oscillation intensity $A_i(t)$ according to elapse of time that is caused by stimulated emission. In addition, $E_{Ci}(t)$ illustrated in Numerical Expression 4 represents the increasing rate of the oscillation intensity $A_i(t)$ according to elapse of time that is caused by spontaneous emission.

A term related to $\lambda_i$ in Numerical Expressions 4 and 5 is a term relating to the interaction of one body. A description will be given of a method that the interaction implementing unit 5 generates the injection light pulse for implementing the interaction of one body (the proportionality coefficient $\lambda_i$ with respect to $\sigma_i$) for the pseudo spin pulse SPi.

The interaction computing unit 4 computes the interaction of one body (the proportionality coefficient $\lambda_i$ with respect to $\sigma_i$). When $\lambda_i$ is positive, the interaction implementing unit 5 performs phase modulation that slows the oscillation phase by $\pi/2$ and performs amplitude modulation proportional to $|\lambda_i|$ for the local oscillation pulse LO (the oscillation phase 0) to generate the injection light pulse. When $\lambda_i$ is negative, the interaction implementing unit 5 performs phase modulation that quickens the oscillation phase by $\pi/2$ and performs amplitude modulation proportional to $|\lambda_i|$ for the local oscillation pulse LO (the oscillation phase 0) to generate the injection light pulse.

$(\omega/Q)A\{-\lambda_i \sin \phi_i(t)\}$ illustrated in Numerical Expression 4 represents the change rate of the oscillation intensity $A_i(t)$ according to elapse of time in the i-th site when the injection light pulse for implementing the interaction of one body (the proportionality coefficient $\lambda_i$ with respect to $\sigma_i$) for the pseudo spin pulse SPi is generated. In Numerical Expression 4, A is a proportionality constant.

$(1/A_i(t))(\omega/Q)A\{-\lambda_i \cos \phi_i(t)\}$ illustrated in Numerical Expression 5 represents the change rate of the oscillation phase $\phi_i(t)$ according to elapse of time in the i-th site when the injection light pulse for implementing the interaction of one body (the proportionality coefficient $\lambda_i$ with respect to $\sigma_i$) for the pseudo spin pulse SPi is generated. In Numerical Expression 5, A is a proportionality constant.

A term related to $J_{ij}$ in Numerical Expressions 4 and 5 is a term relating to the interaction of two bodies. A description will be given of a method that the interaction implementing unit 5 generates the injection light pulse for implementing the interaction of two bodies (the proportionality coefficient $\Sigma J_{ij}\sigma_j$ with respect to $\sigma_i$) for the pseudo spin pulse SPi.

The tentative spin measuring unit 3 measures the oscillation phase $\phi_j(t)$ and the pseudo spin $\sigma_j$ of the pseudo spin pulse SPj before this circular propagation. The interaction computing unit 4 computes the interaction of two bodies (the proportionality coefficient $\Sigma J_{ij}\sigma_j$ with respect to $\sigma_i$). For between i-th and j-th sites, when $J_{ij}$ is positive, the interaction implementing unit 5 performs phase modulation that moves the oscillation phase to $\phi_j(t)$ and performs further phase-reversing, and performs amplitude modulation proportional to $|J_{ij}|$, for the local oscillation pulse LO (the oscillation phase 0) to generate the injection light pulse. For between i-th and j-th sites, when $J_{ij}$ is negative, the interaction implementing unit 5 performs phase modulation that moves the oscillation phase to $\phi_j(t)$ but does not perform further phase-reversing, and performs amplitude modulation proportional to $|J_{ij}|$, for the local oscillation pulse LO (the oscillation phase 0) to generate the injection light pulse. The interaction implementing unit 5 generates the injection light pulse as described above, for all the combinations between i-th and j-th sites.

$-(\omega/Q)(1/2) J_{ij}A \cos \{\phi_j(t)-\phi_i(t)\}$ illustrated in Numerical Expression 4 represents the change rate of the oscillation intensity $A_i(t)$ according to elapse of time in the i-th site when the injection light pulse for implementing the interaction of two bodies (the proportionality coefficient $\Sigma J_{ij}\sigma_j$ with respect to $\sigma_i$) for the pseudo spin pulse SPi is generated. $\Sigma$ ($j\neq i$) illustrated in Numerical Expression 4 represents contributions made from all the sites (the j-th site) other than the i-th site to the i-th site.

$-(1/A_i(t))(\omega/Q)(1/2)J_{ij}A \sin \{\phi_j(t)-\phi_i(t)\}$ illustrated in Numerical Expression 5 represents the change rate of the oscillation phase $\phi_i(t)$ according to elapse of time in the i-th site when the injection light pulse for implementing the interaction of two bodies (the proportionality coefficient $\Sigma J_{ij}\sigma_j$ with respect to $\sigma_i$) for the pseudo spin pulse SPi is generated. Σ (j≠i) illustrated in Numerical Expression 5 represents contributions made from all the sites (the j-th site) other than the i-th site to the i-th site.

A term related to $K_{ijk}$ in Numerical Expressions 4 and 5 is a term relating to the interaction of three bodies. A description will be given of a method that the interaction implementing unit 5 generates the injection light pulse for implementing the interaction of three bodies (the proportionality coefficient $\Sigma K_{ijk}\sigma_j\sigma_k$ with respect to $\sigma_i$) for the pseudo spin pulse SPi.

The tentative spin measuring unit 3 measures the oscillation phases $\phi_j(t)$ and $\phi_k(t)$, and the pseudo spins $\sigma_j$ and $\sigma_k$ of the pseudo spin pulses SPj and SPk respectively before this circular propagation. The interaction computing unit 4 computes the interaction of three bodies (the proportionality coefficient $\Sigma K_{ijk}\sigma_j\sigma_k$ with respect to $\sigma_i$). For between i-th, j-th, and k-th sites, when $K_{ijk}$ is positive, the interaction implementing unit 5 performs phase modulation that moves the oscillation phase to $\phi_{jk}(t)$ and performs further phase-reversing, and performs amplitude modulation proportional to $|K_{ijk}|$, for the local oscillation pulse LO (the oscillation phase 0) to generate the injection light pulse. For between i-th, j-th, and k-th sites, when $K_{ijk}$ is negative, the interaction implementing unit 5 performs phase modulation that moves the oscillation phase to $\phi_{jk}(t)$ but does not perform further phase-reversing, and performs amplitude modulation proportional to $|K_{ijk}|$, for the local oscillation pulse LO (the oscillation phase 0) to generate the injection light pulse. The interaction implementing unit 5 generates the injection light pulse as described above, for all the combinations between i-th, j-th, and k-th sites. $\phi_{jk}(t)$ is described later by using Numerical Expression 12.

$-(\omega/Q)(1/2)K_{ijk}A\cos\{\phi_{jk}(t)-\phi_i(t)\}$ illustrated in Numerical Expression 4 represents the change rate of the oscillation intensity $A_i(t)$ according to elapse of time in the i-th site when the injection light pulse for implementing the interaction of three bodies (the proportionality coefficient $\Sigma K_{ijk}\sigma_j\sigma_k$ with respect to $\sigma_i$) for the pseudo spin pulse SPi is generated. $\Sigma$ (j, k≠i) illustrated in Numerical Expression 4 represents contributions made from all the sites (the j-th and k-th sites) other than the i-th site to the i-th site.

$-(1/A_i(t))(\omega/Q)(1/2)K_{ijk}A\sin\{\phi_{jk}(t)-\phi_i(t)\}$ illustrated in Numerical Expression 5 represents the change rate of the oscillation phase $\phi_i(t)$ according to elapse of time in the i-th site when the injection light pulse for implementing the interaction of three bodies (the proportionality coefficient $\Sigma K_{ijk}\tau_j\tau_k$ with respect to $\sigma_i$) for the pseudo spin pulse SPi is generated. $\Sigma$ (j, k≠i) illustrated in Numerical Expression 5 represents contributions made from all the sites (the j-th and k-th sites) other than the i-th site to the i-th site.

$F_A$, $F_\phi$, and $F_N$ represent noises in the oscillation intensity $A_i(t)$, the oscillation phase $\phi_i(t)$, and the inverted population number difference of the carrier $N_{Ci}(t)$ in the i-th site, respectively.

In the steady state, Numerical Expression 4 can be represented as Numerical Expression 8.

$$\frac{d}{dt}A_i(t) = 0 \qquad \text{[Numerical Expression 8]}$$

By transforming Numerical Expression 8 with $F_A$ being ignored, Numerical Expression 9 is formed.

$$E_{Ci}(t) = \frac{\omega}{Q} + 2\frac{\omega}{Q}\frac{A}{A_i(t)}\lambda_i\sin\phi_i(t) + \qquad \text{[Numerical Expression 9]}$$

-continued $$\frac{\omega}{Q}\sum_{j\neq i}^{M} J_{ij}\frac{A}{A_i(t)}\cos\{\phi_j(t)-\phi_i(t)\} +$$

$$\frac{\omega}{Q}\sum_{j,k\neq i}^{M} K_{ijk}\frac{A}{A_i(t)}\cos\{\phi_{jk}(t)-\phi_i(t)\}$$

Here, Numerical Expressions 10 and 11 are satisfied. Thus, when it is set as Numerical Expression 12 in consideration of the similarity between the Ising model and the laser system, Numerical Expression 9 can be represented as Numerical Expression 13.

$$-1 \leq \sigma_i, \sigma_j, \sigma_k \leq +1 \qquad \text{[Numerical Expression 10]}$$

$$-1 \leq \sin\phi_i(t), \sin\phi_j(t), \sin\phi_{jk}(t) \leq +1 \qquad \text{[Numerical Expression 11]}$$

$$\sigma_i = \sin\phi_i(t), \sigma_j = \sin\phi_j(t), \sigma_j\sigma_k = \sin\phi_{jk}(t) \qquad \text{[Numerical Expression 12]}$$

$$E_{Ci}(t) = \frac{\omega}{Q} + 2\frac{\omega}{Q}\frac{A}{A_i(t)}\lambda_i\sigma_i + \qquad \text{[Numerical Expression 13]}$$

$$\frac{\omega}{Q}\sum_{j\neq i}^{M} J_{ij}\frac{A}{A_i(t)}\{\cos\phi_i(t)\cos\phi_j(t)+\sigma_i\sigma_j\} +$$

$$\frac{\omega}{Q}\sum_{j,k\neq i}^{M} K_{ijk}\frac{A}{A_i(t)}$$

$$\{\cos\phi_i(t)\cos\phi_{jk}(t)+\sigma_i\sigma_j\sigma_k\}$$

Here, in order to implement the interaction of two bodies (the proportionality coefficient $\Sigma J_{ij}\sigma_j$ with respect to $\sigma_i$) for the pseudo spin pulse SPi, it is sufficient only to superpose linearly the pseudo spin pulses SPi and SPj. However, in order to implement the interaction of three bodies (the proportionality coefficient $\Sigma K_{ijk}\sigma_j\sigma_k$ with respect to $\sigma_i$) for the pseudo spin pulse SPi, it is not sufficient only to superpose linearly the pseudo spin pulses SPi, SPj, and SPk.

However, usage of non-linear effect between the pseudo spin pulses SPi, SPj, and SPk makes the circuit configuration of the Ising model quantum computation device Q complicated. Therefore, if it is set that $\sigma_j\sigma_k=\sin\phi_{jk}(t)$ as illustrated in Numerical Expression 12, the linear superposition between the pseudo spin pulse SPi and the injection light pulse can be used to simplify the circuit configuration of the Ising model quantum computation device Q.

By adding Numerical Expression 13 for all the M sites, Numerical Expression 14 is acquired and is represented as a threshold gain $\Sigma E_{Ci}$ of the whole laser system.

$$\sum_i^M E_{Ci}(t) = 2\frac{\omega}{Q}\left[\frac{M}{2} + \sum_i^M \frac{A}{A_i(t)}\lambda_i\sigma_i + \right. \qquad \text{[Numerical Expression 14]}$$

$$\sum_{i<j}^M J_{ij}\frac{A}{A_i(t)}\{\cos\phi_i(t)\cos\phi_j(t)+\sigma_i\sigma_j\} +$$

$$\sum_{i<j,k}^M K_{ijk}\frac{A}{A_i(t)}$$

$$\left.\{\cos\phi_i(t)\cos\phi_{jk}(t)+\sigma_i\sigma_j\sigma_k\}\right]$$

Here, hypothetically, Numerical Expression 15 is satisfied. Then, in the steady state, Numerical Expressions 16 and 17 are satisfied. In such a case, Numerical Expression 14 is formed as Numerical Expression 18.

$$A_i(t) = A_j(t) \text{ (for all } i \neq j) \quad \text{[Numerical Expression 15]}$$

$$\sigma_i, \sigma_j, \sigma_k = \pm 1 \quad \text{[Numerical Expression 16]}$$

$$\phi_i(t), \phi_j(t), \phi_{jk}(t) = \pm \pi/2 \quad \text{[Numerical Expression 17]}$$

$$\sum_i^M E_{Ci}(t) = \quad \text{[Numerical Expression 18]}$$

$$2\frac{\omega}{Q}\left\{\frac{M}{2} + \sum_i^M \lambda_i \sigma_i + \sum_{i<j}^M J_{ij}\sigma_i\sigma_j + \sum_{i<j,k}^M K_{ijk}\sigma_i\sigma_j\sigma_k\right\}$$

Here, in a case where medium of the laser is a uniform medium, an oscillation phase state $\{\sigma_i\}$ realizing a minimum threshold gain $\Sigma E_{Ci}$ as the whole laser system is selected. In other words, one specific oscillation mode is selected as the whole laser system. Then, owing to competition between oscillation modes, one specific oscillation mode suppresses other oscillation modes. In other words, $\Sigma E_{Ci}$ illustrated in Numerical Expression 18 is minimized as the whole laser system. On the other hand, $(\omega/Q)M$ represented in Numerical Expression 18 is constant as the whole laser system. Accordingly, $\Sigma\lambda_i\sigma_i + \Sigma J_{ij}\sigma_i\sigma_j + \Sigma K_{ijk}\sigma_i\sigma_j\sigma_k$ represented in Numerical Expression 18 is minimized as the whole laser system. In other words, a ground state minimizing the Ising Hamiltonian of Numerical Expression 3 is realized.

Here, in order to improve the computation precision, it is necessary for a laser oscillation mode of the whole laser system to configure a difference between a minimal threshold gain and a next minimal threshold gain to be sufficiently larger than $\beta(\omega/Q)(1/R)$ that is a difference between a saturation gain $E_C$ determined based on the spontaneous emission rate and the photon attenuation rate $\omega/Q$. Here, $R=I/I_{th}-1$ is a normalized pumping rate, and I and $I_{th}$ are an injection current and a threshold of the laser oscillation thereof. Accordingly, by decreasing $\beta$ and increasing R, the computation precision can be improved.

As described by using FIG. 4 and FIG. 5, since the plurality of pseudo spin pulses SPi have mutually the identical oscillation frequency, it is not possible that the oscillation phases $\phi_i(t=0)$ in the initial state of respective pseudo spin pulses SPi are close to one phase and far from the other phase of two kinds of oscillation phases $\phi_i(\text{steady})=\pm\pi/2$ in the steady state of the respective pseudo spin pulses SPi. Accordingly, in the Ising model quantum computation device Q, the reading error can be prevented.

Then, when the number of Ising sites is M, M surface emission lasers V are required in the first and second conventional technologies, while it is enough to prepare only one parametric oscillator 1 in the present disclosure. Furthermore, when the number of Ising sites is M, M(M−1)/2 Ising interaction implementing units are required in the first and second conventional technologies, while it is enough to prepare only one system feedback loop in the present disclosure. Accordingly, in the Ising model quantum computation device Q, the circuit configuration can be simplified.

Furthermore, the interaction of three or more bodies of the Ising model can be implemented in a range of linear superposition of each pseudo spin pulse SPi and each injection light pulse. Here, when the interaction of three bodies of the Ising model is implemented, it is set that $\sigma_j\sigma_k=\sin\phi_{jk}(t)$ as illustrated in Numerical Expression 12, and the linear superposition of the pseudo spin pulse SPi and the injection light pulse is performed. Then, when the interaction of three bodies or more of the Ising model is implemented, it is set that $\sigma_j\sigma_k\sigma_l\ldots=\sin\phi_{jkl}\ldots(t)$ ($\phi$ is product of (N−1) $\sigma$ for the interaction of N bodies) similar to Numerical Expression 12, and the linear superposition of the pseudo spin pulse SPi and the injection light pulse is performed.

(Configuration of Ising Model Quantum Computation Device of First Embodiment)

Figure 6:
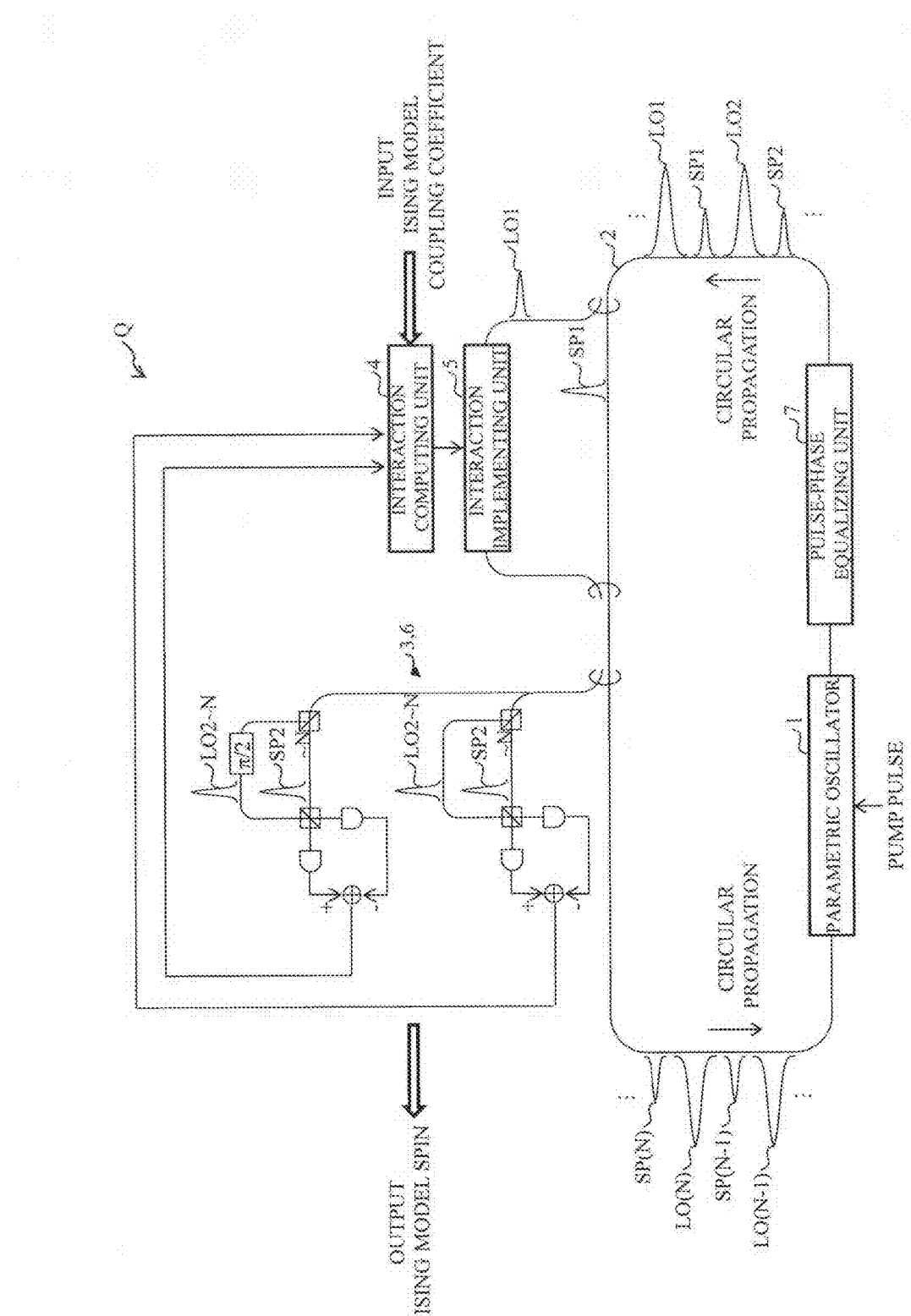
FIG. 6 is a diagram that illustrates a configuration of an Ising model quantum computation device of a first embodiment.

A configuration of an Ising model quantum computation device Q of a first embodiment is illustrated in FIG. 6.

A parametric oscillator 1 parametrically oscillates a plurality of local oscillation pulses LO1 to LO(N) that have an oscillation frequency identical to the oscillation frequency of a plurality of pseudo spin pulses SP1 to SP(N) and pair with the plurality of pseudo spin pulses SP1 to SP(N) one-on-one. A ring resonator 2 circularly propagates the plurality of local oscillation pulses LO1 to LO(N). The plurality of pseudo spin pulses SP1 to SP(N) and the plurality of local oscillation pulses LO1 to LO(N) enter a feedback loop in the following order; LO1, SP1, . . . , LO(N), SP(N), LO1, SP1, . . . , LO(N), SP(N), . . . .

Here, the plurality of pseudo spin pulses SP1 to SP(N) are parametrically oscillated by using the pump pulse at the proximity of the oscillation threshold. Then, the plurality of local oscillation pulses LO1 to LO(N) are parametrically oscillated by using the pump pulse sufficiently above the oscillation threshold.

A pulse-phase equalizing unit 7 equalizes phases of the plurality of local oscillation pulses LO1 to LO(N) from a state including both positive phases and negative phases to a state including one of positive phases and negative phases. Accordingly, the pulse-phase equalizing unit 7 can make the phases of the plurality of local oscillation pulses LO1 to LO(N) zero as illustrated in FIG. 5. For example, the pulse-phase equalizing unit 7 includes a delay line for two pulses (The adjacent local oscillation pulses LO sandwich one pseudo spin pulse SP.) and a phase modulator. However, the pulse-phase equalizing unit 7 should perform phase modulation only for the plurality of local oscillation pulses LO1 to LO(N), and should not perform phase modulation also for the plurality of pseudo spin pulses SP1 to SP(N), thus switching the phase modulator on and off.

A tentative spin measuring unit 3 performs homodyne detection for a part of the plurality of pseudo spin pulses SP1 to SP(N) by using a part of the plurality of local oscillation pulses LO1 to LO(N) that pair with the plurality of pseudo spin pulses SP1 to SP(N) one-on-one. Here, the tentative spin measuring unit 3 measures cos component and sin component and includes the delay line for one pulse (The pseudo spin pulse SP and the local oscillation pulse LO that pair one-on-one are adjacent.) in a measuring unit of each component.

An interaction computing unit 4 is, for example, FPGA (Field Programmable Gate Array) and inputs Ising model coupling coefficients $\lambda_i$, $J_{ij}$, and $K_{ijk}$. An interaction implementing unit 5 injects the local oscillation pulses LOi that pair with certain pseudo spin pulses SPi one-on-one and part of which have controlled amplitudes and phases, to the certain pseudo spin pulse SPi. Here, the interaction implementing unit 5 is placed on the delay line for one pulse (The pseudo spin pulse SP and the local oscillation pulse LO that pair one-on-one are adjacent.).

A pseudo spin measuring unit 6, which is shared with the tentative spin measuring unit 3, performs homodyne detection by using a part of the plurality of local oscillation pulses LO1 to LO(N) that pair with the plurality of pseudo spin pulses SP1 to SP(N) one-on-one, for the part of the plurality of pseudo spin pulses SP1 to SP(N), to output an Ising model spin $\sigma$.

As describe by using FIG. 6, feedback implementation of the magnitude and the sign of the interaction related to each pseudo spin pulse SPi by using the tentative measurement result of the oscillation phases $\phi_i(t)$ of the plurality of pseudo spin pulses SPi can be performed by using a specific configuration. Then, according to the first embodiment, compared with a second embodiment, since the pseudo spin pulse SPi and the local oscillation pulse LOi are paired to circularly propagate in the ring resonator 2, a problem of fluctuation of optical path length from a pulse generator 8 to the spin measuring units 3 and 6 can be solved. Accordingly, in the Ising model quantum computation device Q, the reading error can be prevented.

(Configuration of Ising Model Quantum Computation Device of Second Embodiment)

Figure 7:
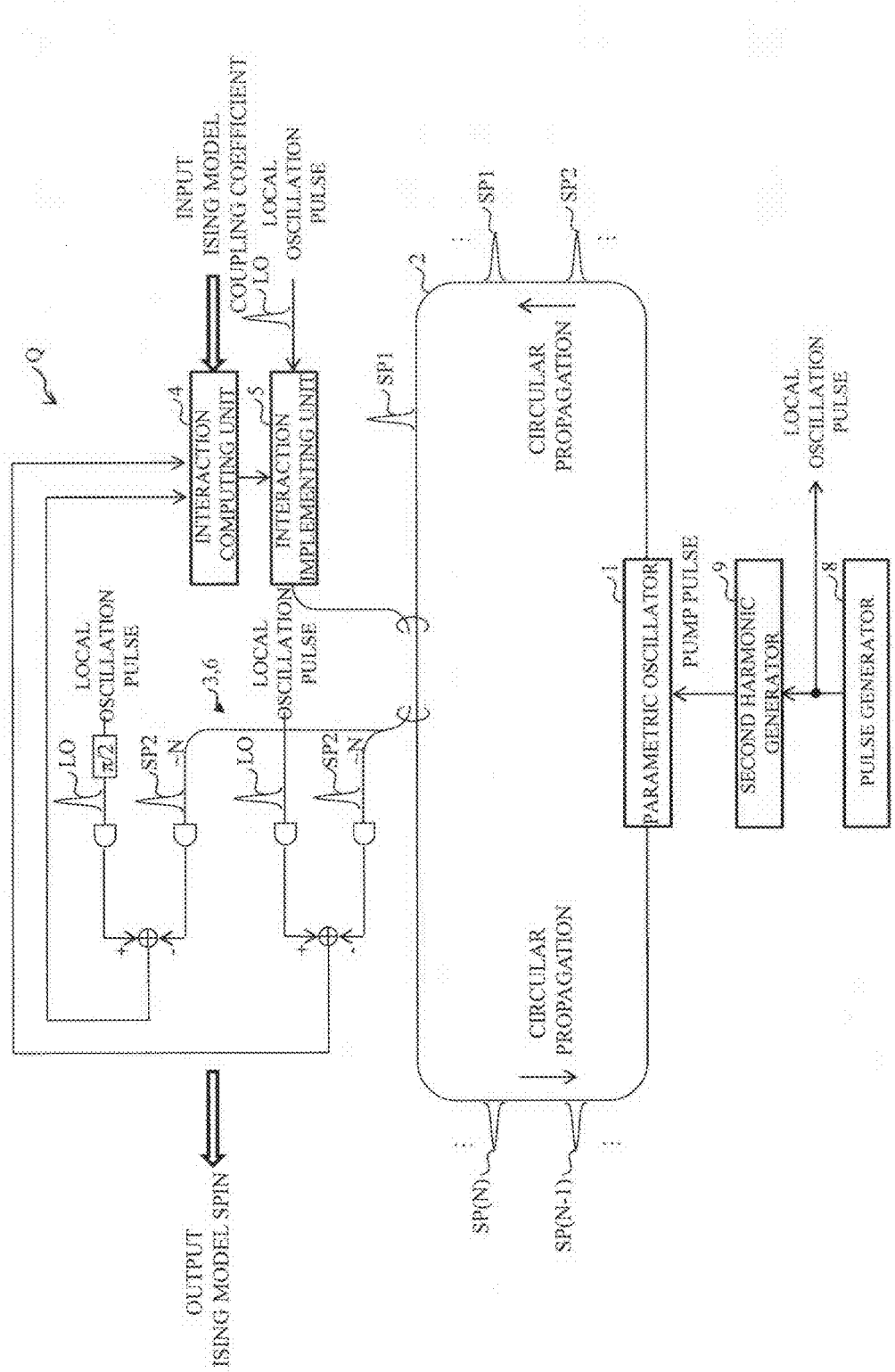
FIG. 7 is a diagram that illustrates a configuration of an Ising model quantum computation device of a second embodiment.

A configuration of an Ising model quantum computation device Q of the second embodiment is illustrated in FIG. 7.

A pulse generator 8 generates a local oscillation pulse LO having an angular frequency $\omega$. A second harmonic generator 9 generates a pulse having an angular frequency $2\omega$ by using the local oscillation pulse LO having the angular frequency $\omega$. A parametric oscillator 1 parametrically oscillates a plurality of pseudo spin pulses SP1 to SP(N) by using the pulse having the angular frequency $2\omega$. The plurality of pseudo spin pulses SP1 to SP(N) enter a feedback loop in the following order; SP1, . . . , SP(N), SP1, . . . , SP(N), . . . .

Here, the plurality of pseudo spin pulses SP1 to SP(N) are parametrically oscillated by using the pump pulse at the proximity of the oscillation threshold. Then, the pulse generator 8 includes, for example, a mode locking laser. Accordingly, the pulse generator 8 can make the phase of the local oscillation pulse LO having the angular frequency $\omega$ zero as illustrated in FIG. 5.

A tentative spin measuring unit 3 performs homodyne detection for a part of the plurality of pseudo spin pulses SP1 to SP(N) by using the local oscillation pulse LO having the angular frequency $\omega$. Here, the tentative spin measuring unit 3 measures cos component and sin component.

An interaction computing unit 4 is, for example, FPGA (Field Programmable Gate Array) and inputs Ising model coupling coefficients $\lambda_i$, $J_{ij}$, and $K_{ijk}$. An interaction implementing unit 5 injects the local oscillation pulse LO having the angular frequency $\omega$ with a controlled amplitude and phase to a certain pseudo spin pulse SPi.

A pseudo spin measuring unit 6, which is shared with the tentative spin measuring unit 3, performs homodyne detection by using the local oscillation pulse LO having the angular frequency $\omega$ for a part of the plurality of pseudo spin pulses SP1 to SP(N), to output an Ising model spin $\sigma$.

As described by using FIG. 7, feedback implementation of the magnitude and the sign of the interaction related to each pseudo spin pulse SPi by using the tentative measurement result of the oscillation phases $\phi_i(t)$ of the plurality of pseudo spin pulses SPi can be performed by using a specific configuration. Then, according to the second embodiment, compared with the first embodiment, since the pseudo spin pulse SPi and the local oscillation pulse LO are not paired to circularly propagate in the ring resonator 2, crosstalk between the pseudo spin pulse SPi and the local oscillation pulse LOi can be removed, whereby ensuring removing of a pulse-phase equalizing unit 7 that equalizes all the local oscillation pulses LOi. Accordingly, in the Ising model quantum computation device Q, the reading error can be prevented.

(Computation Result of Ising Model Quantum Computation Device of Present Disclosure)

Figure 8:
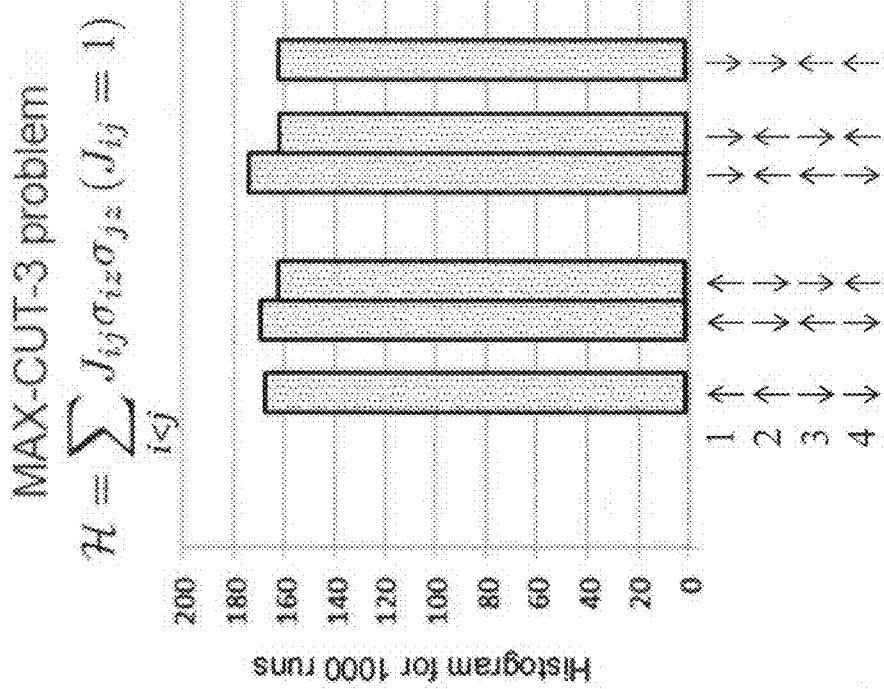
FIG. 8 is a diagram that illustrates a computation result of the Ising model quantum computation device of the present disclosure.
Figure 9:
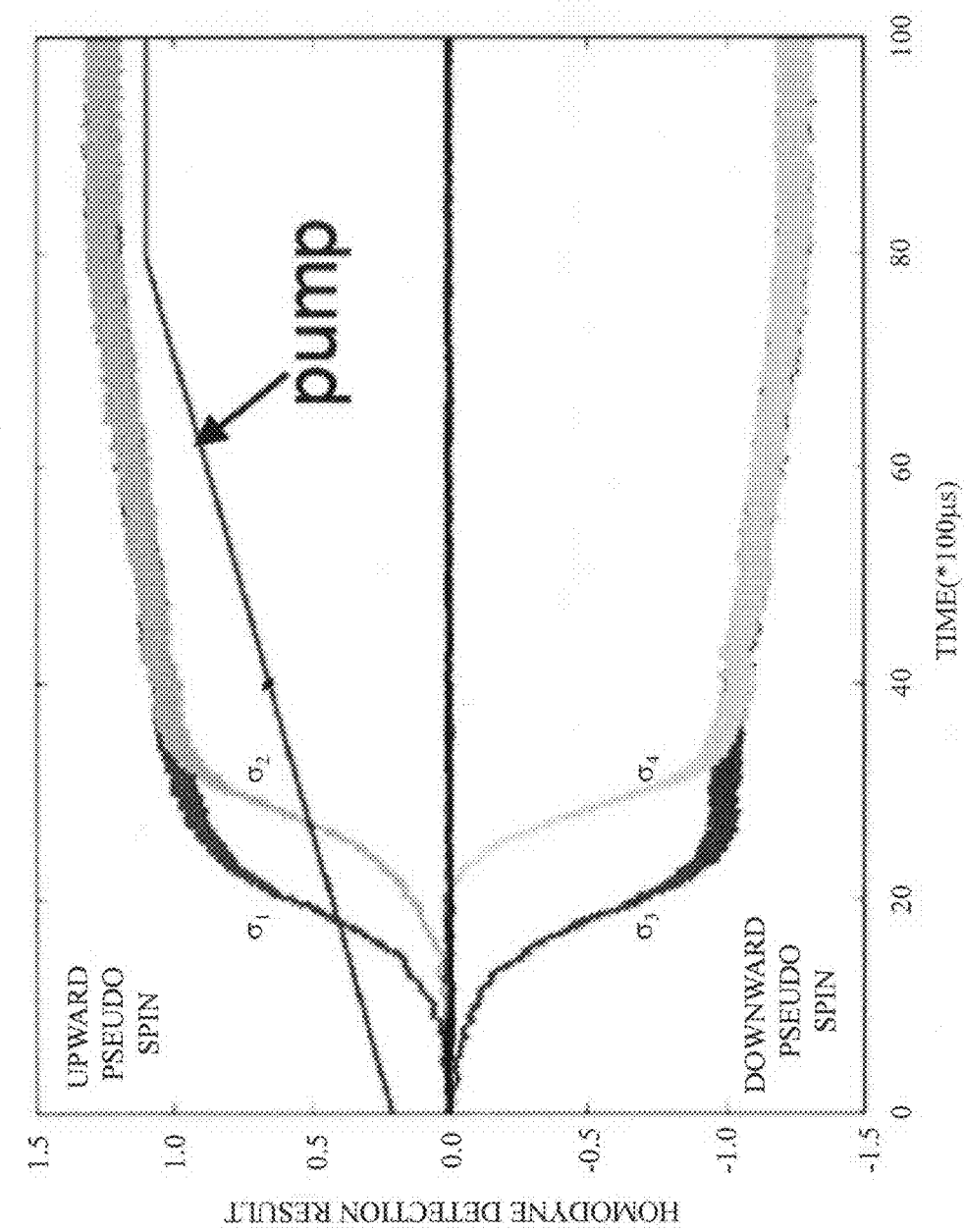
FIG. 9 is a diagram that illustrates temporal development of the Ising model quantum computation device of the present disclosure.

As simulation results of the rate equations in Numerical Expressions 4 to 7, the computation result and the temporal development of the Ising model quantum computation device Q including the interaction of two bodies are illustrated in FIG. 8 and FIG. 9. The Ising model Hamiltonian is illustrated at the upper stage in FIG. 8.

It is known that spins $\sigma$ in certain two sites are upward, and spins $\sigma$ in other two sites are downward, in minimum energy states of this Hamiltonian, and these minimum energy states exist in six ways, irrespective of the rate equations in Numerical Expressions 4 to 7.

In FIG. 8, as a result that the computation process of the present disclosure has been repeated 1000 times, six kinds of minimum energy states have been derived with an approximately equal probability, while other energy state has not been derived. In other words, it has been found that the error rate is equal to or less than $10^{-3}$.

In FIG. 9, the temporal development of the homodyne detection result is oriented to the minimum energy state, where $\sigma_1=\sigma_2=+1$ and $\sigma_3=\sigma_4=-1$. A required time from the initial state to the steady state was ~40×100 µs. Here, the time on the horizontal axis in FIG. 9 is a time normalized by a light life of a resonator (100 µs in the ring resonator 2 configured of an optical fiber with a length of 2 km).

Figure 10:
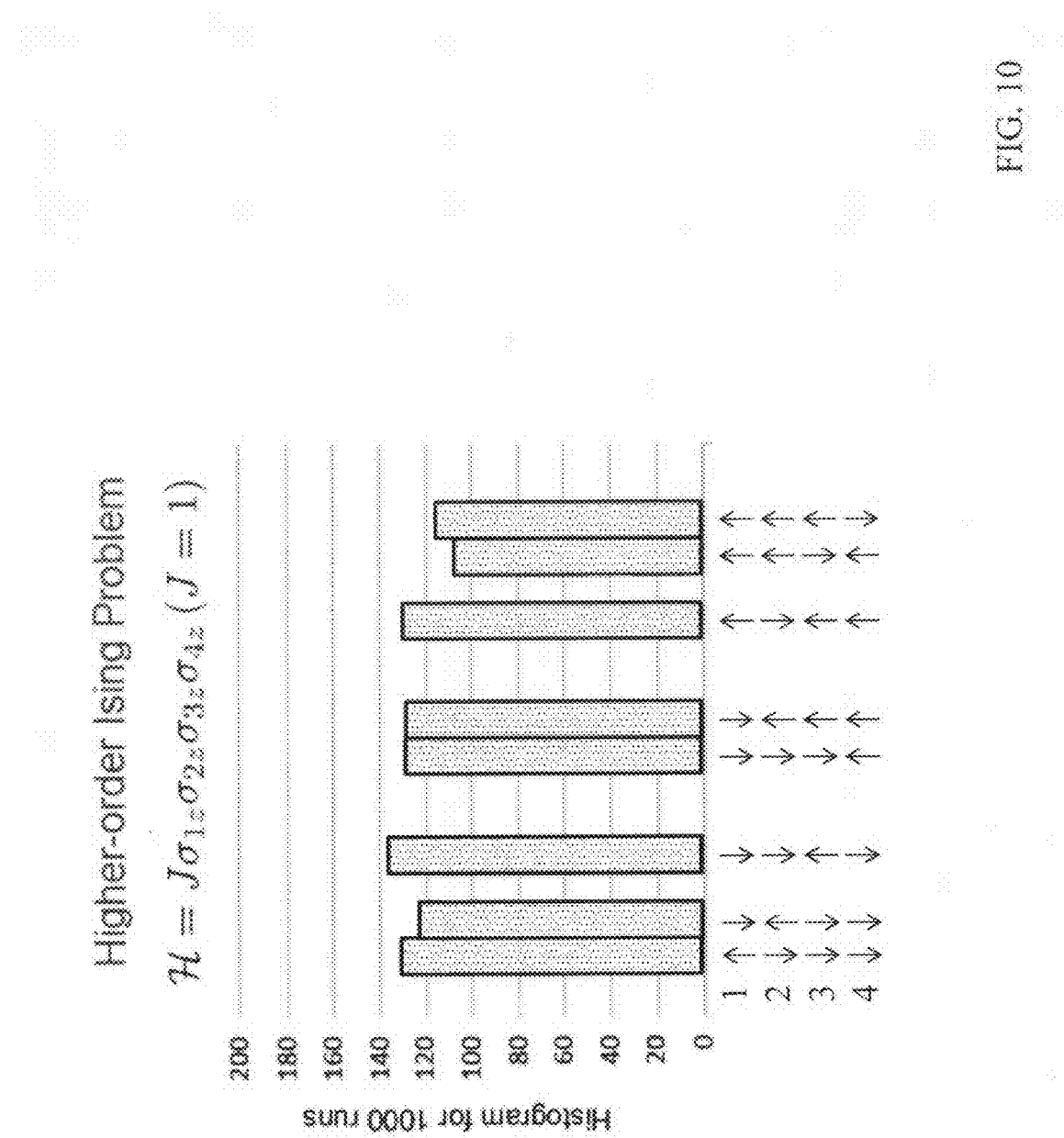
FIG. 10 is a diagram that illustrates a computation result of the Ising model quantum computation device of the present disclosure.
Figure 11:
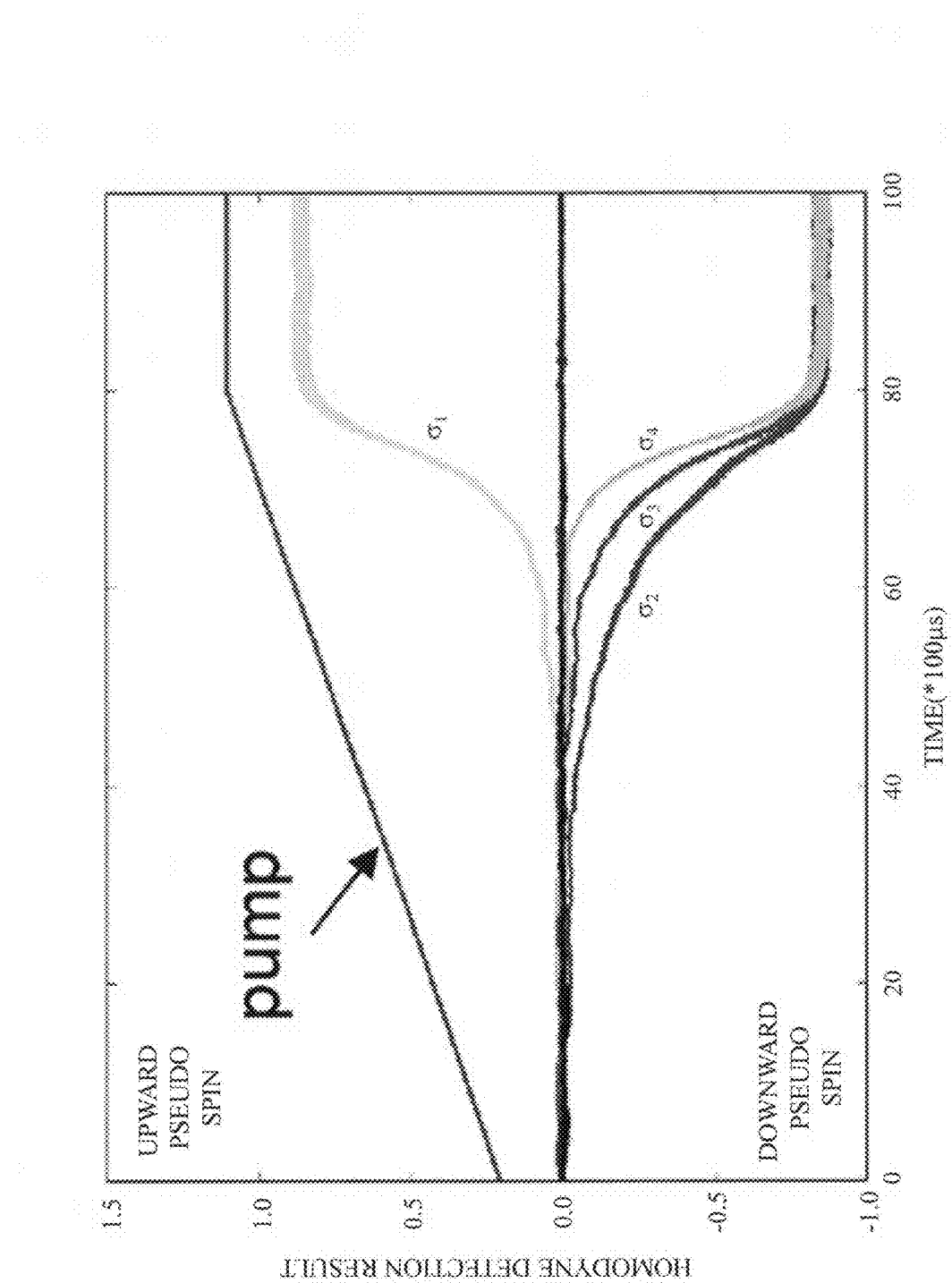
FIG. 11 is a diagram that illustrates temporal development of the Ising model quantum computation device of the present disclosure.

As the simulation result of the rate equations in Numerical Expressions 4 to 7, the computation result and the temporal development of the Ising model quantum computation device Q including interaction of four bodies are illustrated in FIG. 10 and FIG. 11. The Ising model Hamiltonian is illustrate at the upper stage in FIG. 10.

It is known that a spin $\sigma$ in certain one site and spins $\sigma$ in other three sites have mutually different signs in minimum energy states of this Hamiltonian, and these minimum energy states exist in eight ways, irrespective of the rate equations in Numerical Expressions 4 to 7.

In FIG. 10, as a result that the computation process of the present disclosure has been repeated 1000 times, eight kinds of minimum energy states have been derived with an approximately equal probability, while other energy state has not been derived. In other words, it is found that the error rate is equal to or less than $10^{-3}$.

In FIG. 11, the temporal development of the homodyne detection result is oriented to the minimum energy state, where $\sigma_1=\alpha 1$, $\sigma_2=\sigma_3=\sigma_4=-1$. A required time from the initial state to the steady state was ~80×100 µs. Here, the time on the horizontal axis in FIG. 11 is a time normalized by a light life of a resonator (100 µs in the ring resonator 2 configured of an optical fiber with a length of 2 km).

Here, a question arises that the reading result of each pseudo spin pulse SP is not necessarily a correct answer at the initial stage of the computation process, thus if an incorrect answer is fed back at the initial stage of the computation process, the correct answer cannot be obtained at the terminal stage of the computation process.

Therefore, the interaction implementing unit 5 controls the amplitude of light injected to a certain pseudo spin pulse SP larger at the initial stage of the computation process and smaller at the terminal stage of the computation process. In other words, the interaction implementing unit 5 controls the proportionality constant A in Numerical Expressions 4 and 5 larger at the initial stage of a computation process and smaller at the terminal stage of the computation process.

Accordingly, at the initial stage of the computation process, it is possible to make the reading result of each pseudo spin pulse SP as a correct answer as possible. Even when the reading result of the certain pseudo spin pulse SP is not a correct answer at the initial stage of the computation process, if a correct answer for other pseudo spin pulse SP is fed back, a correct answer for all the pseudo spin pulses SP can be obtained at the terminal stage of the computation process. In other words, in the Ising model quantum computation device Q, the reading error can be prevented.

Figure 12:
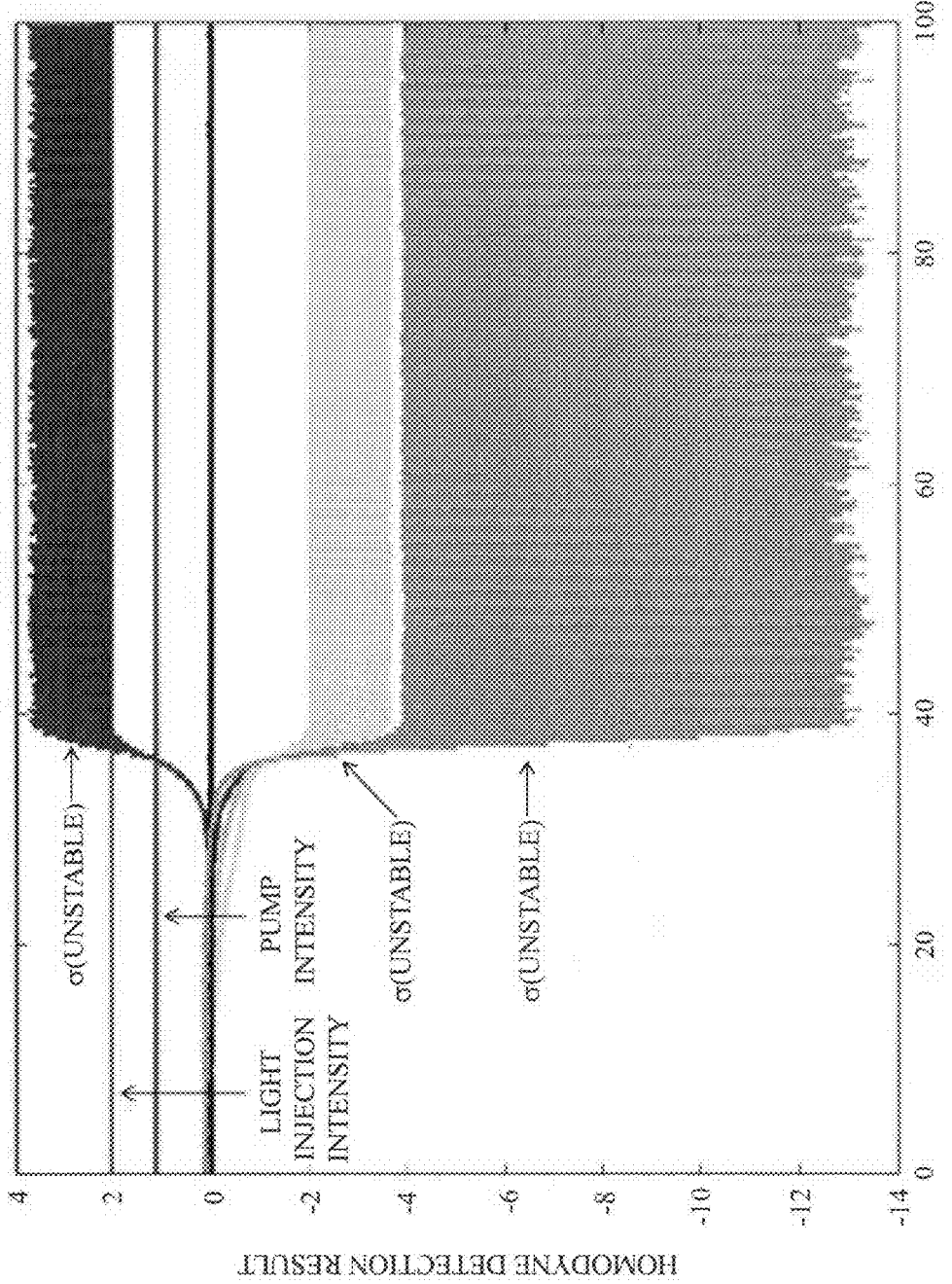
FIG. 12 is a diagram that illustrates temporal development in a case where light injection intensity is constant at all the stages of a computation process.

The temporal development in a case where the light injection intensity is constant at all the stages of the computation process is illustrated in FIG. 12. In the case in FIG. 12, an unstable oscillation state occurs in the steady state.

Figure 13:
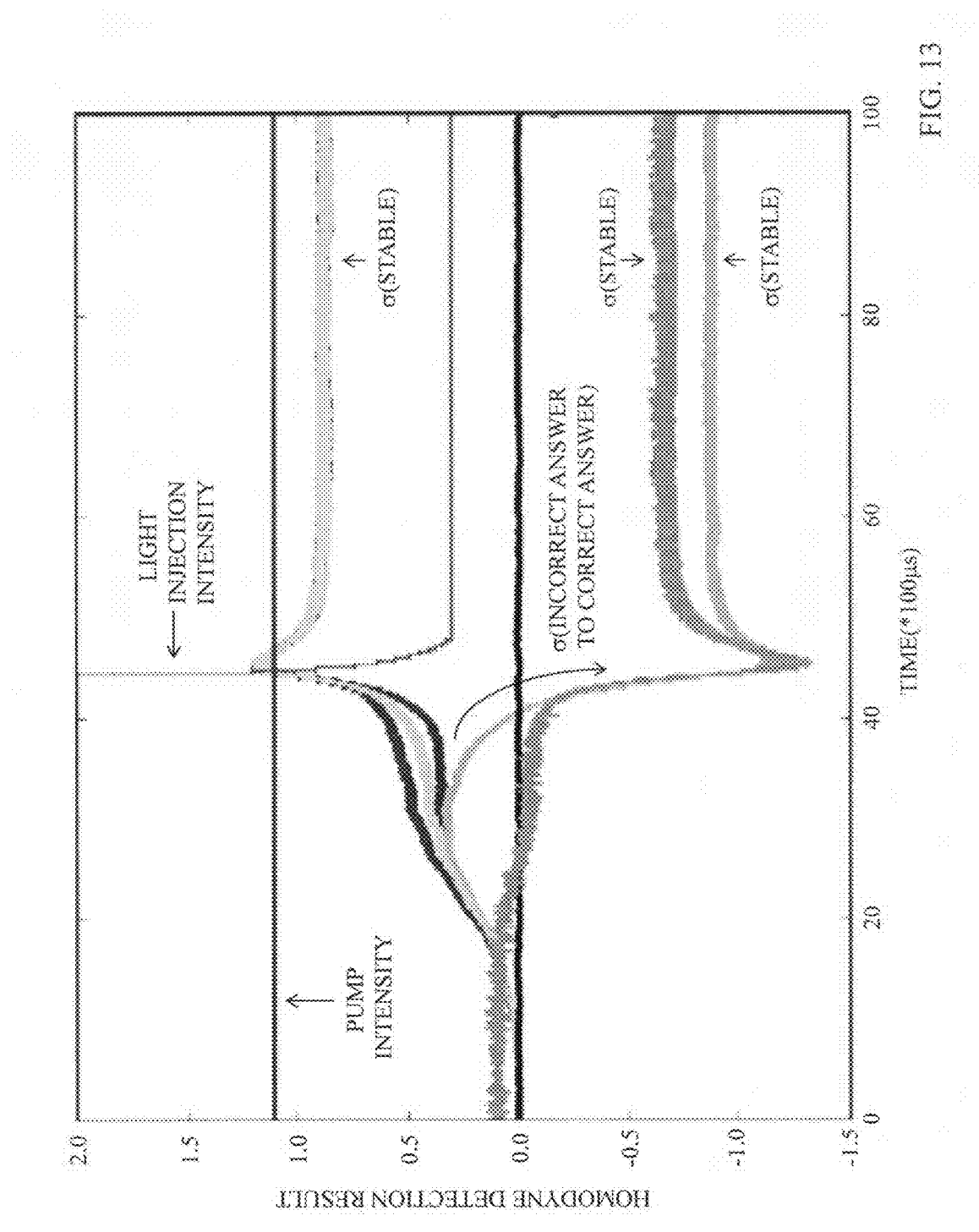
FIG. 13 is a diagram that illustrates temporal development in a case where light injection intensity is high at an initial stage of the computation process.

The temporal development in a case where the light injection intensity is high at the initial stage of the computation process is illustrated in FIG. 13. In the case in FIG. 13, attenuating the light injection intensity immediately before the oscillation threshold removes the unstable oscillation state in the steady state. Then, increasing the light injection intensity at the initial stage can obtain the correct answer at the terminal stage for a certain pseudo spin pulse SP, even if the incorrect answer is obtained at the initial stage.

Then, by assuming that $A_i(t)=A_j(t)$ illustrated in Numerical Expression 15, $\lambda_i$, $J_{ij}$, and $K_{ijk}$ are obtained as the Ising model coupling coefficients in Numerical Expression 18. However, if $A_i(t)=A_j(t)$ illustrated in Numerical Expression 15 is not satisfied, a problem arises that, $\lambda'_i$, $J'_{ij}$, and $K'_{ijk}$, which are different from $\lambda_i$, $J_{ij}$, and $K_{ijk}$ respectively, are obtained as the Ising model coupling coefficients in Numerical Expression 18.

Therefore, the spin measuring units 3 and 6 tentatively measure the amplitude of the plurality of pseudo spin pulses SP, every time the plurality of pseudo spin pulses SP circularly propagate in the ring resonator 2. Then, the parametric oscillator 1 performs feedback control for the amplitude of the pump pulse used for parametric oscillation such that the amplitude of the plurality of pseudo spin pulses SP become equal, based on the amplitude of the plurality of pseudo spin pulses SP that the spin measuring units 3 and 6 have measured.

Accordingly, a problem of substantive rewriting of the Ising model coupling coefficients $\lambda_i$, $J_{ij}$, and $K_{ijk}$ by lack of balance of the amplitude of each pseudo spin pulse SP can be removed. In other words, in the Ising model quantum computation device Q, the reading error can be prevented.

Figure 14:
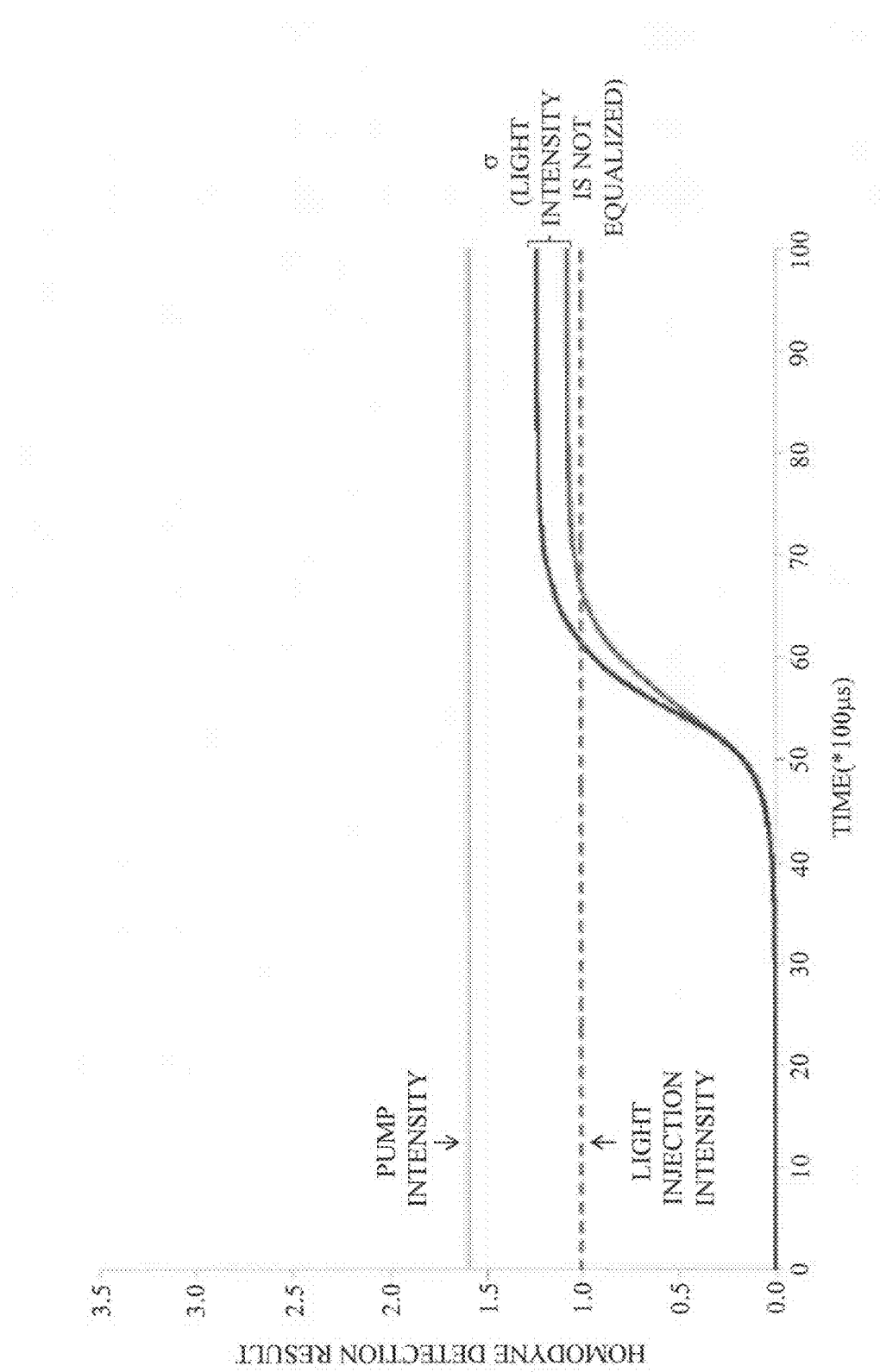
FIG. 14 is a diagram that illustrates temporal development in a case where intensity of a plurality of pseudo spin pulses is not equalized.

The temporal development in a case where the intensity of the plurality of pseudo spin pulses is not equalized is illustrated in FIG. 14. In the case in FIG. 14, irrespective of the intensity of each pseudo spin pulse SP, the intensity of the pump pulse is controlled to be similar for each pseudo spin pulse SP. Accordingly, it is not necessarily that the intensity of each pseudo spin pulse SP is surely equalized.

Figure 15:
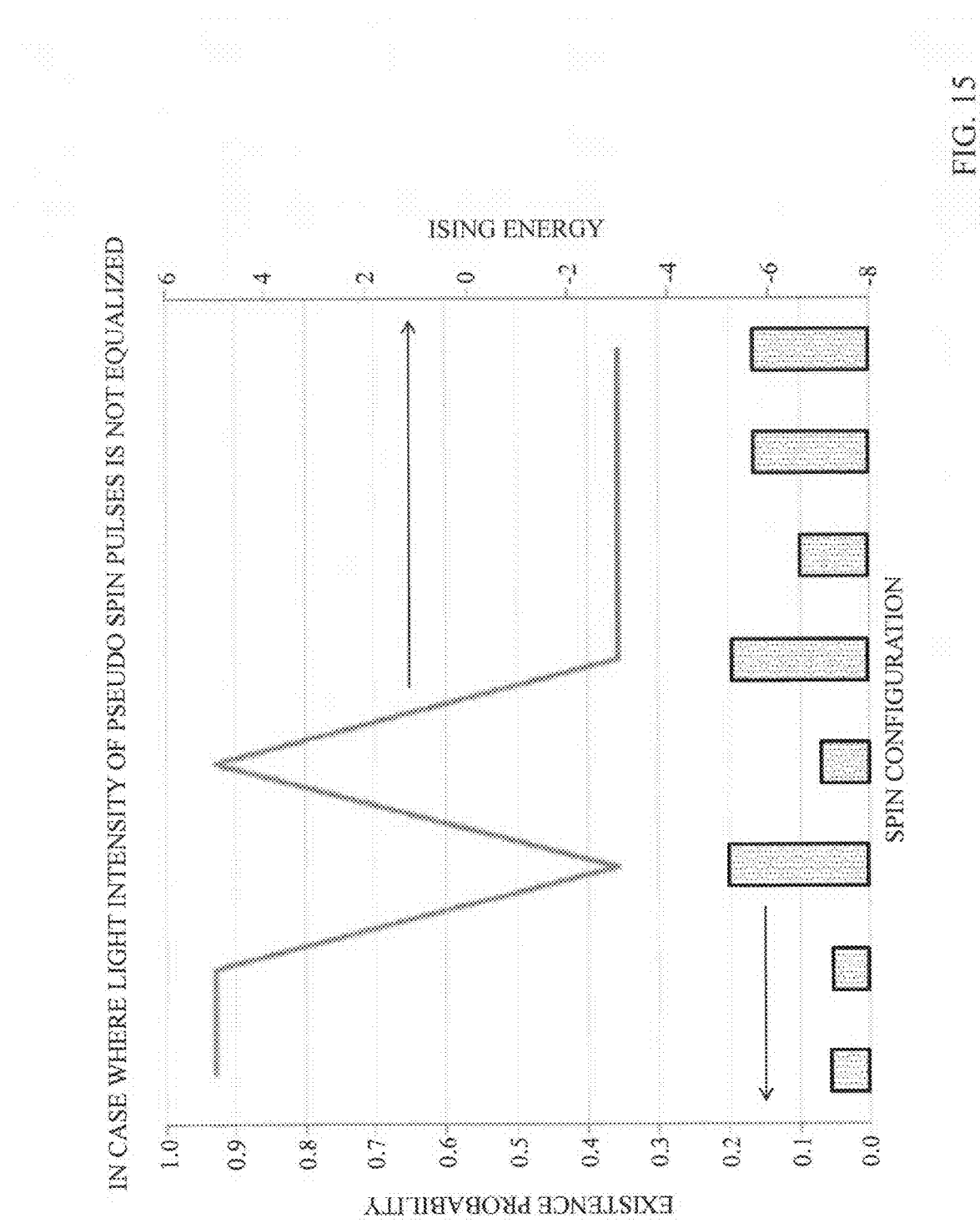
FIG. 15 is a diagram that illustrates computation precision in the case where the intensity of the plurality of pseudo spin pulses is not equalized.

The computation precision in the case where the intensity of the plurality of pseudo spin pulses is not equalized is illustrated in FIG. 15. An existence probability (illustrated in the histogram) in a state where Ising energy (illustrated in the line graph) is low is high in an ideal case, however is low in the case in FIG. 15.

Figure 16:
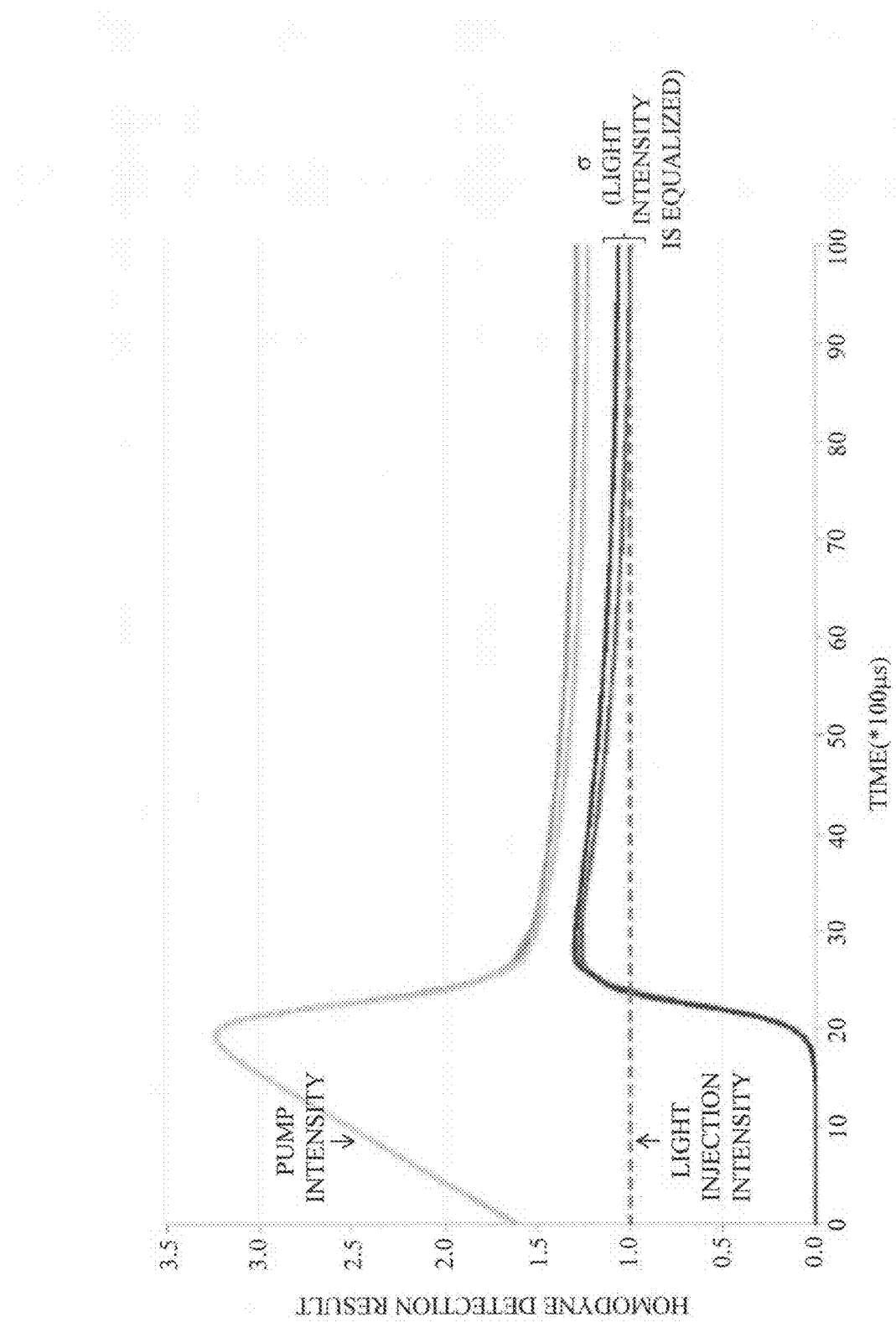
FIG. 16 is a diagram that illustrates temporal development in a case where the intensity of the plurality of pseudo spin pulses is equalized.

The temporal development in a case where the intensity of the plurality of pseudo spin pulses is equalized is illustrated in FIG. 16. In the case in FIG. 16, corresponding to the intensity of each pseudo spin pulse SP, the intensity of the pump pulse is each controlled (The intensity may be mutually similar or different.) for each pseudo spin pulse SP. Accordingly, the intensity of each pseudo spin pulse SP can be surely equalized.

Figure 17:
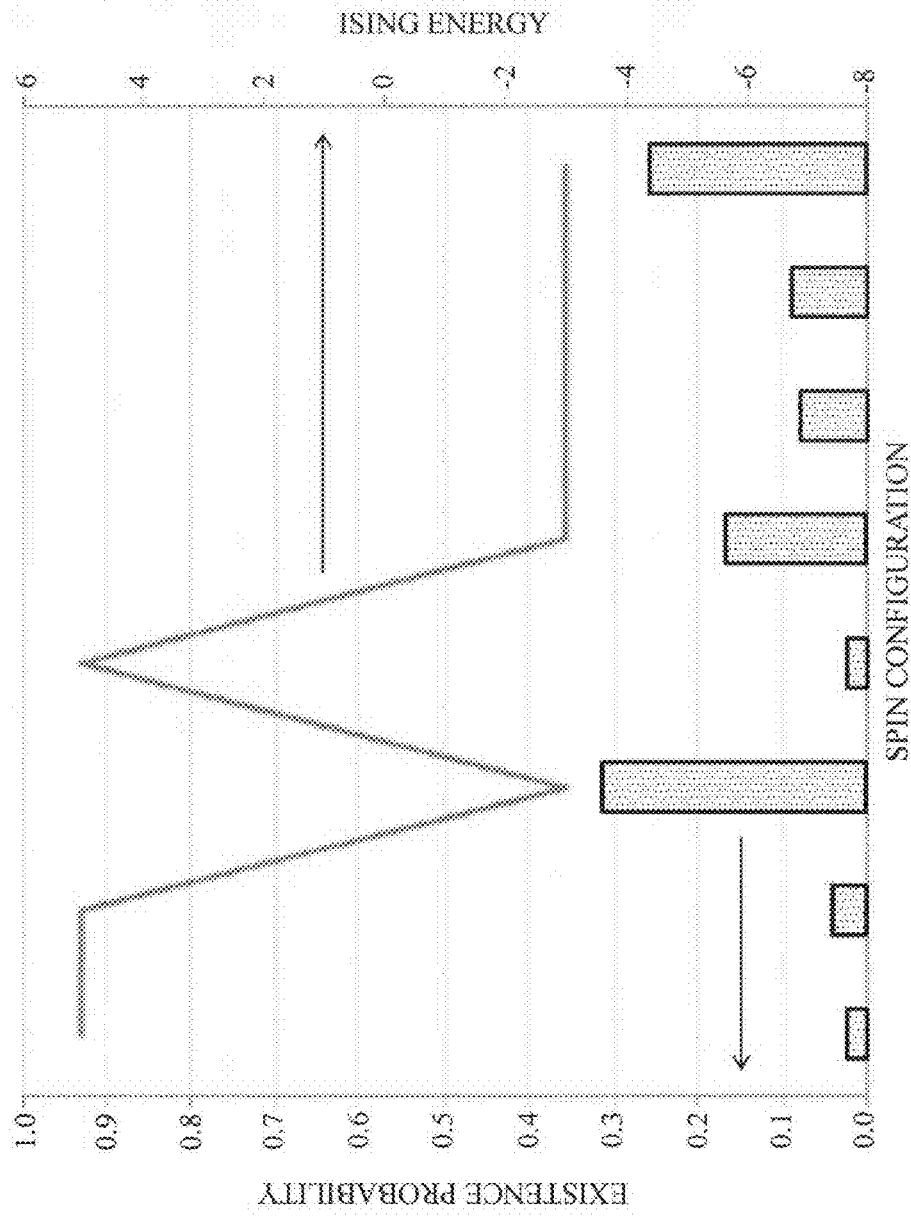
FIG. 17 is a diagram that illustrates computation precision in the case where the intensity of the plurality of pseudo spin pulses is equalized.

The computation precision in the case where the intensity of the plurality of pseudo spin pulses is equalized is illustrated in FIG. 17. An existence probability (illustrated in the histogram) in a state where Ising energy (illustrated in the line graph) is low is high in an ideal case, and is high in the case in FIG. 17.

(Loop Procedures of Ising Model Quantum Computation Method of Present Disclosure)

Figure 18:
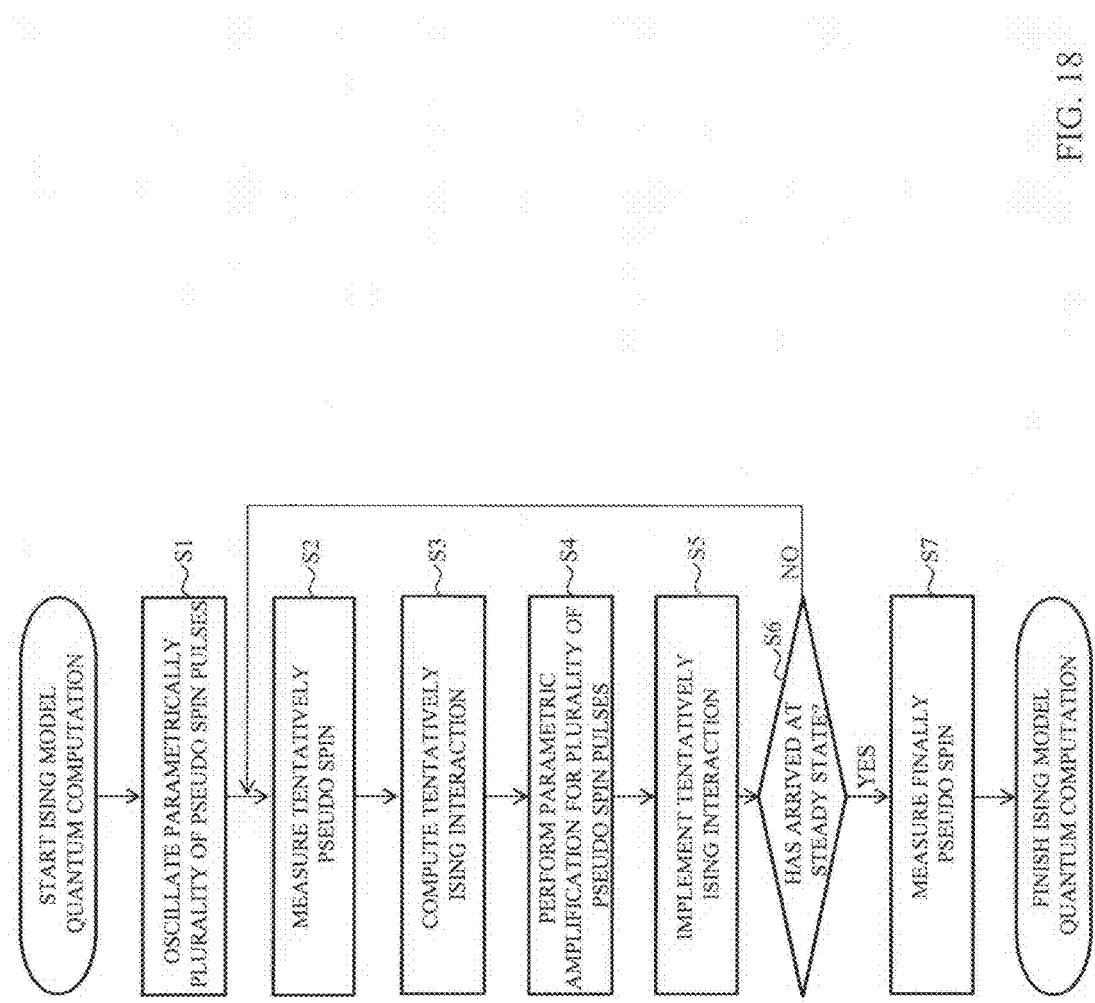
FIG. 18 is a diagram that illustrates a loop procedure of an Ising model quantum computation method of the present disclosure.
Figure 19:
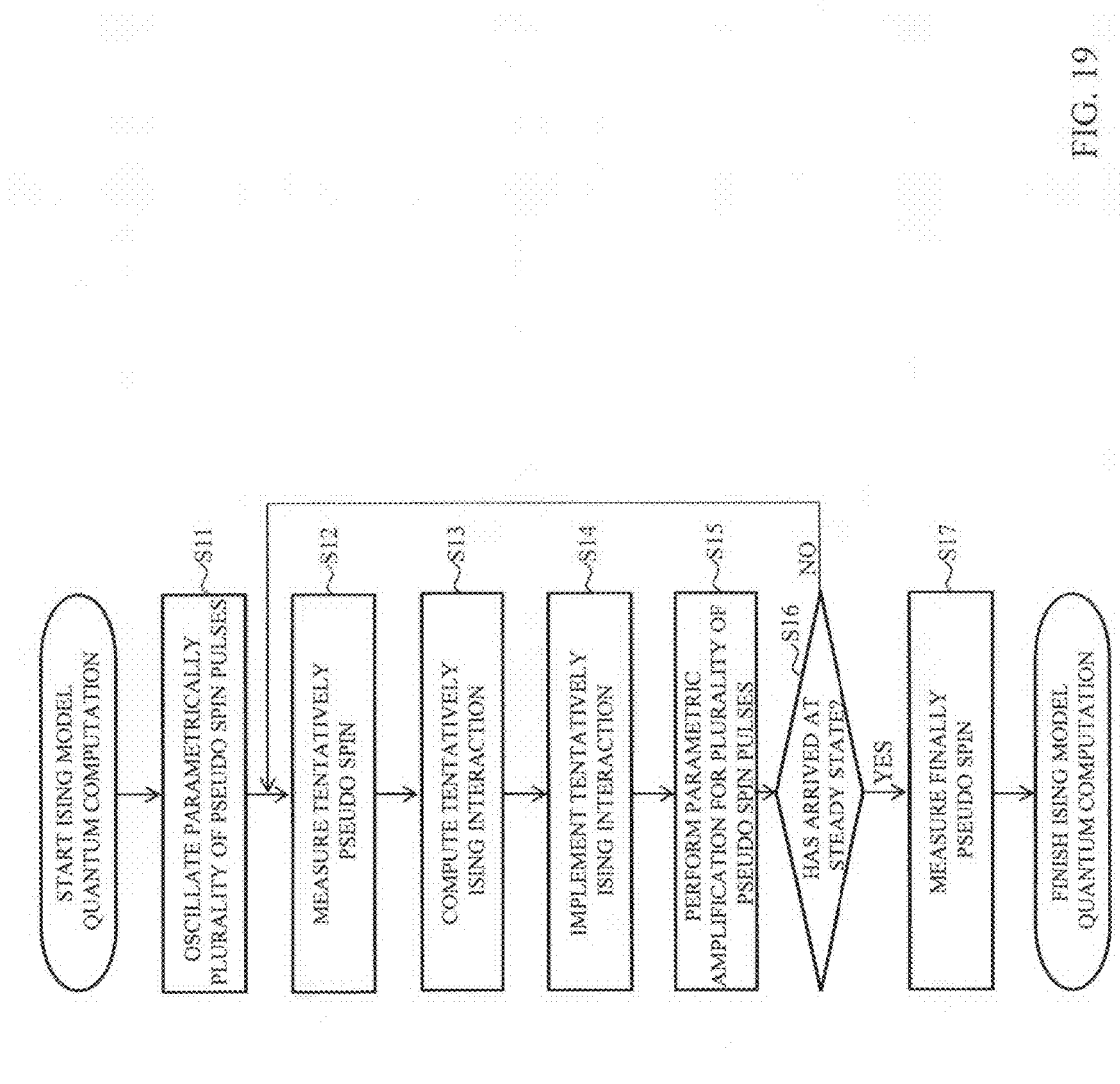
FIG. 19 is a diagram that illustrates a loop procedure of the Ising model quantum computation method of the present disclosure.

Loop procedures of the Ising model quantum computation method of the present disclosure are illustrated in FIGS. 18 and 19.

In order to realize the loop procedure of the Ising model quantum computation method illustrated in FIG. 18, as the Ising model quantum computation devices Q illustrated in FIGS. 4, 6, and 7, the tentative spin measuring unit 3 (or the pseudo spin measuring unit 6), the parametric oscillator 1, and the interaction implementing unit 5 are arranged in this order in a circular propagation direction of the pseudo spin pulses SP in the ring resonator 2.

The parametric oscillator 1 parametrically oscillates the plurality of pseudo spin pulses SP (Step S1). The tentative spin measuring unit 3 tentatively measures the pseudo spins σ (Step S2). The interaction computing unit 4 tentatively computes the Ising interaction (Step S3). The parametric oscillator 1 parametrically amplifies the plurality of pseudo spin pulses SP (Step S4). The interaction implementing unit 5 tentatively implements the Ising interaction (Step S5). Steps S3 and S4 may exchange the order.

When the plurality of pseudo spin pulses SP have not arrived at the steady state (NO at Step S6), the loop procedure at Steps S2 to S6 is repeated. When the plurality of pseudo spin pulses SP have arrived at the steady state (YES at Step S6), the pseudo spin measuring unit 6 finally measures the pseudo spins σ (Step S7).

As above, although the parametric amplifying Step S4 enters between the tentative spin measuring Step S2 and the interaction implementing Step S5, thereby a time lag is generated to some extent, the interaction that has practically no delay between the Ising model sites can be implemented.

In order to realize the loop procedure of the Ising model quantum computation method illustrated in FIG. 19, unlike the Ising model quantum computation devices Q illustrated in FIGS. 4, 6, and 7, the parametric oscillator 1, the tentative spin measuring unit 3 (or the pseudo spin measuring unit 6), and the interaction implementing unit 5 are arranged in this order in the circular propagation direction of the pseudo spin pulses SP in the ring resonator 2.

The parametric oscillator 1 parametrically oscillates the plurality of pseudo spin pulses SP (Step S11). The tentative spin measuring unit 3 tentatively measures the pseudo spins σ (Step S12). The interaction computing unit 4 tentatively computes the Ising interaction (Step S13). The interaction implementing unit 5 tentatively implements the Ising interaction (Step S14). The parametric oscillator 1 parametrically amplifies the plurality of pseudo spin pulses SP (Step S15). Steps S13 and S15 do not exchange the order.

When the plurality of pseudo spin pulses SP have not arrived at the steady state (NO at Step S16), the loop procedure at Steps S12 to S16 is repeated. When the plurality of pseudo spin pulses SP have arrived at the steady state (YES at Step S16), the pseudo spin measuring unit 6 finally measures the pseudo spins σ (Step S17).

As above, since the parametric amplifying Step S15 does not enter between the tentative spin measuring Step S12 and the interaction implementing Step S14, thereby the time lag is hardly generated, the interaction that has little delay between the Ising model sites can be implemented.

(Configurations of Ising Model Quantum Parallel Computation Device of Present Disclosure)

Figure 20:
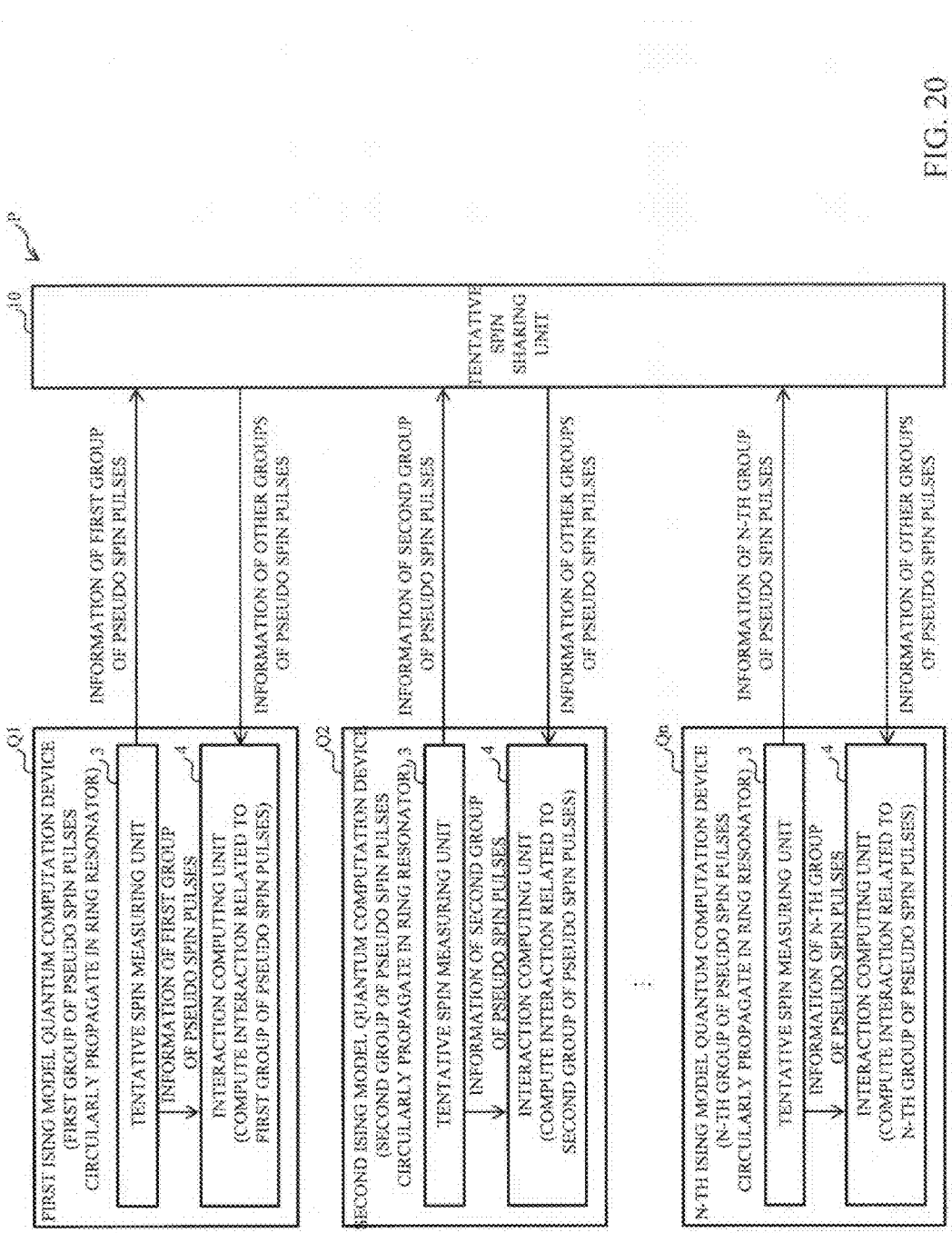
FIG. 20 is a diagram that illustrates a configuration of an Ising model quantum parallel computation device of the present disclosure.
Figure 21:
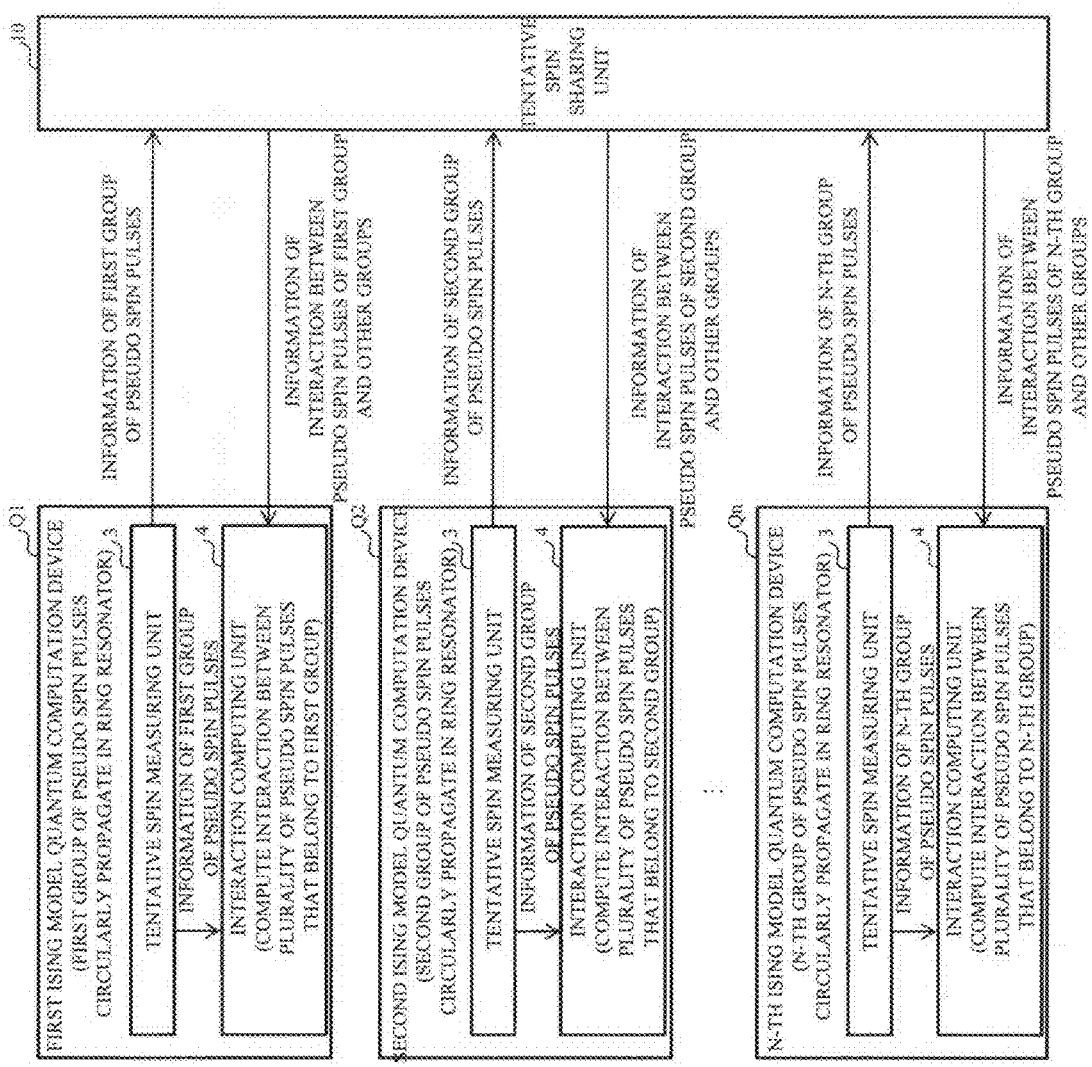
FIG. 21 is a diagram that illustrates a configuration of the Ising model quantum parallel computation device of the present disclosure.

Configurations of an Ising model quantum parallel computation device P of the present disclosure are illustrated in FIGS. 20 and 21.

The Ising model quantum parallel computation device P includes first, second, . . . , and n-th Ising model quantum computation devices Q1, Q2, . . . , and Qn in parallel. As the first, second, . . . , and n-th Ising model quantum computation devices Q1, Q2, . . . , and Qn, the Ising model quantum computation devices Q illustrated in FIGS. 4, 6, and 7 and the Ising model quantum computation methods illustrated in FIGS. 18 and 19 are applicable. In the first, second, . . . , and n-th Ising model quantum computation devices Q1, Q2, . . . , and Qn, among the plurality of Ising model spins σ, first group, second group, . . . , and n-th group of pseudo spin pulses SP, which are in correspondence with the first group, second group, . . . , and n-th group of spins σ respectively in a pseudo manner, circularly propagate in each ring resonator 2.

A tentative spin sharing unit 10 shares information of pseudo spins σ of the first group, second group, . . . , and n-th group of pseudo spin pulses SP that each tentative spin measuring unit 3, which the first, second, . . . , and n-th Ising model quantum computation devices Q1, Q2, . . . , and Qn include, has tentatively measured, among the Ising model quantum computation devices Q1, Q2, . . . , and Qn included in parallel.

The Ising model quantum parallel computation device P illustrated in FIG. 20 will be described. Each tentative spin measuring unit 3 of the first, second, . . . , and n-th Ising model quantum computation devices Q1, Q2, . . . , and Qn outputs the information of the pseudo spins σ of the first group, second group, . . . , and n-th group of pseudo spin pulses SP to the tentative spin sharing unit 10 and each interaction computing unit 4.

The tentative spin sharing unit 10 outputs the information of the pseudo spins σ of the pseudo spin pulses SP of other groups (such as the second group and n-th group) other than the first group, to the interaction computing unit 4 of the first Ising model quantum computation device Q1. The tentative spin sharing unit 10 outputs the information of the pseudo spins σ of the pseudo spin pulses SP of other groups (such as the first group and n-th group) other than the second group, to the interaction computing unit 4 of the second Ising model quantum computation device Q2 . . . . The tentative spin sharing unit 10 outputs the information of the pseudo spins σ of the pseudo spin pulses SP of other groups (such as the first group and second group) other than the n-th group, to the interaction computing unit 4 of the n-th Ising model quantum computation device Qn.

The interaction computing unit 4 of the first Ising model quantum computation device Q1 holds the Ising model coupling coefficient related to the first group of pseudo spin pulse SP to compute tentatively the interaction related to the first group of pseudo spin pulse SP. The interaction computing unit 4 of the second Ising model quantum computation device Q2 holds the Ising model coupling coefficient related to the second group of pseudo spin pulse SP to compute tentatively the interaction related to the second group of pseudo spin pulse SP . . . . The interaction computing unit 4 of the n-th Ising model quantum computation device Qn holds the Ising model coupling coefficient related to the n-th group of pseudo spin pulse SP to compute tentatively the interaction related to the n-th group of pseudo spin pulse SP.

As above, even when the number of the Ising model sites is large, the plurality of Ising model quantum computation devices Q1, Q2, . . . , and Qn perform parallel dispersion processes, whereby ensuring the reduction of computation processing burden of each of Ising model quantum computation devices Q1, Q2, . . . , and Qn.

In the Ising model quantum parallel computation device P illustrated in FIG. 20, the tentative spin sharing unit 10 outputs the information of the pseudo spin σ of the pseudo spin pulse SP to the interaction computing units 4 of the plurality of Ising model quantum computation devices Q1, Q2, . . . , and Qn. Accordingly, in the interaction computing units 4 of the plurality of Ising model quantum computation devices Q1, Q2, . . . , and Qn, the computation processing burden of the interaction between the pseudo spin pulses SP is not reduced. However, compared with the Ising model quantum computation devices Q illustrated in FIGS. 4, 6, and 7, in each of the Ising model quantum computation devices Q1, Q2, . . . , and Qn illustrated in FIG. 20, the computation processing burden is reduced.

The Ising model quantum parallel computation device P illustrated in FIG. 21 will be described. Each tentative spin measuring unit 3 of the first, second, . . . , and n-th Ising model quantum computation devices Q1, Q2, . . . , and Qn outputs the information of the pseudo spins σ of the first group, second group, . . . , and n-th group of pseudo spin pulses SP to the tentative spin sharing unit 10 and each interaction computing unit 4.

The tentative spin sharing unit 10 holds the Ising model coupling coefficient related to the pseudo spin pulses SP of the first group and other groups (such as the second group and n-th group), to output the information of the interaction between the pseudo spin pulses SP of the first group and the other groups to the interaction computing unit 4 of the first Ising model quantum computation device Q1. The tentative spin sharing unit 10 holds the Ising model coupling coefficient related to the pseudo spin pulses SP of the second group and other groups (such as the first group and n-th group), to output the information of the interaction between the pseudo spin pulses SP of the second group and the other groups to the interaction computing unit 4 of the second Ising model quantum computation device Q2 . . . . The tentative spin sharing unit 10 holds the Ising model coupling coefficient related to the pseudo spin pulses SP of the n-th group and other groups (such as the first group and second group), to output the information of the interaction between the pseudo spin pulses SP of the n-th group and the other groups to the interaction computing unit 4 of the n-th Ising model quantum computation device Qn.

The interaction computing unit 4 of the first Ising model quantum computation device Q1 holds the Ising model coupling coefficient related to the plurality of pseudo spin pulses SP that belongs to the first group, to compute tentatively the interaction between the plurality of pseudo spin pulses SP that belongs to the first group. The interaction computing unit 4 of the second Ising model quantum computation device Q2 holds the Ising model coupling coefficient related to the plurality of pseudo spin pulses SP that belongs to the second group, to compute tentatively the interaction between the plurality of pseudo spin pulses SP that belongs to the second group . . . . The interaction computing unit 4 of the n-th Ising model quantum computation device Qn holds the Ising model coupling coefficient related to the plurality of pseudo spin pulses SP that belongs to the n-th group, to compute tentatively the interaction between the plurality of pseudo spin pulses SP that belongs to the n-th group.

As above, even when the number of the Ising model sites is large, the plurality of Ising model quantum computation devices Q1, Q2, . . . , and Qn perform parallel dispersion processes, whereby ensuring the reduction of computation processing burden of each of Ising model quantum computation devices Q1, Q2, . . . , and Qn.

In the Ising model quantum parallel computation device P illustrated in FIG. 21, the tentative spin sharing unit 10 outputs the information of the interaction between the pseudo spin pulses SP to the interaction computing units 4 of the plurality of Ising model quantum computation devices Q1, Q2, . . . , and Qn. Accordingly, in the interaction computing units 4 of the plurality of Ising model quantum computation devices Q1, Q2, . . . , and Qn, the computation processing burden of the interaction between the pseudo spin pulses SP is reduced. In other words, compared with each of the Ising model quantum computation devices Q1, Q2, . . . , and Qn illustrated in FIG. 20, in each of the Ising model quantum computation devices Q1, Q2, . . . , and Qn illustrated in FIG. 21, the computation processing burden is reduced.

INDUSTRIAL APPLICABILITY

The Ising model quantum computation device, the Ising model quantum parallel computation device, and the Ising model quantum computation method of the present disclosure are appropriate for solving an NP-complete problem or the like mapped into an Ising model easily and fast.

REFERENCE SIGNS LIST

V, V1, V2, V3, V4: surface emission laser
M: master laser
I12, I13, I14, I23, I24, I34: Ising interaction implementing unit
Q, Q1, Q2, Qn: Ising model quantum computation device
SP, SP1, SP2, SP3, SP4, SP(N): pseudo spin pulse
LO, LO1 to LON: local oscillation pulse
P: Ising model quantum parallel computation device
1: parametric oscillator
2: ring resonator
3: tentative spin measuring unit
4: interaction computing unit
5: interaction implementing unit
6: pseudo spin measuring unit
7: pulse-phase equalizing unit
8: pulse generator
9: second harmonic generator
10: tentative spin sharing unit

What is claimed is:
1. An Ising model quantum computation device comprising:
a parametric oscillator that parametrically oscillates a plurality of pseudo spin pulses, the plurality of pseudo spin pulses being in correspondence with a plurality of Ising model spins in a pseudo manner and having mutually an identical oscillation frequency;
a ring resonator in which the plurality of pseudo spin pulses circularly propagate;
a temporary pulse detector that temporarily measures phases of the plurality of pseudo spin pulses every time the plurality of pseudo spin pulses circularly propagate in the ring resonator to temporarily measure pseudo spins of the plurality of pseudo spin pulses;
an interaction computing circuit that temporarily computes sum of interaction between a pseudo spin of a certain pseudo spin pulse and a pseudo spin of all other pseudo spin pulses interacting with the pseudo spin of the certain pseudo spin pulse, based on a coupling coefficient of the Ising model related to the pseudo spin of the certain pseudo spin pulse and the pseudo spins of the other pseudo spin pulses having been temporarily measured by the temporary pulse detector;
a pulse injector that controls amplitudes and phases of light injected to the certain pseudo spin pulse to temporarily implement a magnitude and a sign of the sum of the interaction between the pseudo spin of the certain pseudo spin pulse and the pseudo spin of all the other pseudo spin pulses interacting with the pseudo spin of the certain pseudo spin pulse, the sum of the interaction having been temporarily computed by the interaction computing circuit; and
a pseudo pulse detector that measures the phases of the plurality of pseudo spin pulses after the plurality of pseudo spin pulses have arrived at a steady state in a process of repeating a feedback loop configured of the temporary pulse detector, the interaction computing circuit, and the pulse injector to measure the pseudo spins of the plurality of pseudo spin pulses.

2. The Ising model quantum computation device according to claim 1, wherein
the interaction computing circuit temporarily computes the sum of interaction of three or more bodies between the pseudo spin of the certain pseudo spin pulse and the pseudo spin of all the other pseudo spin pulses interacting with the pseudo spin of the certain pseudo spin pulse, based on a coupling coefficient of three or more bodies of the Ising model related to the pseudo spin of the certain pseudo spin pulse and the pseudo spin of the other pseudo spin pulses having been temporarily measured by the temporary pulse detector, and
the pulse injector controls the amplitudes and the phases of light injected to the certain pseudo spin pulse to temporarily implement a magnitude and a sign of the sum of the interaction of three or more bodies between the pseudo spin of the certain pseudo spin pulse and the pseudo spin of all the other pseudo spin pulses interacting with the pseudo spin of the certain pseudo spin pulse, the sum of the interaction having been temporarily computed by the interaction computing circuit.

3. The Ising model quantum computation device according to claim 1, wherein
the parametric oscillator parametrically oscillates a plurality of local oscillation pulses having an oscillation frequencies identical to the oscillation frequencies of the plurality of pseudo spin pulses, the plurality of local oscillation pulses pairing with the plurality of pseudo spin pulses one-on-one,
the ring resonator in which the plurality of local oscillation pulses circularly propagate,
the Ising model quantum computation device further includes a phase modulator that equalizes phases of the plurality of local oscillation pulses from a state including both positive phases and negative phases to a state including one of positive phases and negative phases,
the temporary pulse detector performs homodyne detection for a part of the plurality of pseudo spin pulses by using a part of the plurality of local oscillation pulses that pair with the plurality of pseudo spin pulses one-on-one, the pulse injector injects local oscillation pulses that pair with a plurality of the certain pseudo spin pulses one-on-one and the part of which have the controlled amplitudes and phases, to the plurality of the certain pseudo spin pulses, and the pseudo pulse detector performs homodyne detection for a part of the plurality of pseudo spin pulses by using a part of the plurality of local oscillation pulses that pair with the plurality of pseudo spin pulses one-on-one.

4. The Ising model quantum computation device according to claim 1, further comprising:

a pulse generator that generates a local oscillation pulse having an angular frequency $\omega$; and a second harmonic generator that generates a pulse having an angular frequency $2\omega$ by using the local oscillation pulse having the angular frequency $\omega$, wherein the parametric oscillator parametrically oscillates the plurality of pseudo spin pulses by using the pulse having the angular frequency $2\omega$, the temporary pulse detector performs homodyne detection for a part of the plurality of pseudo spin pulses by using the local oscillation pulse having the angular frequency $\omega$, the pulse injector injects the local oscillation pulse having the angular frequency $\omega$ with a controlled amplitude and phase, to the certain pseudo spin pulse, and the pseudo pulse detector performs homodyne detection for a part of the plurality of pseudo spin pulses by using the local oscillation pulse having the angular frequency $\omega$.

5. The Ising model quantum computation device according to claim 1, wherein the pulse injector controls the amplitude of light injected to the certain pseudo spin pulse larger at an initial stage of a computation process and smaller at a terminal stage of the computation process.

6. The Ising model quantum computation device according to claim 1, further comprising a temporary amplitude detector that temporarily measures amplitudes of the plurality of pseudo spin pulses every time the plurality of pseudo spin pulses circularly propagate in the ring resonator, wherein the parametric oscillator performs feedback control for amplitude of a pump pulse used for parametric oscillation such that the amplitudes of the plurality of pseudo spin pulses become equal based on the amplitudes of the plurality of pseudo spin pulses having been measured by the temporary amplitude detector.

7. An Ising model quantum parallel computation device comprising:

n-th Ising model quantum computation device according to claim 1 where n-th group (n is an integer equal to or more than one) of pseudo spin pulses in correspondence with n-th group of spins in a pseudo manner among the plurality of Ising model spins circularly propagate in the ring resonator; and a temporary spin sharing circuit that shares information of pseudo spins of the n-th group of pseudo spin pulses among the Ising model quantum computation devices included in parallel, the n-th group of pseudo spin pulses having been temporarily measured by the temporary pulse detector in the n-th Ising model quantum computation device.

8. An Ising model quantum computation method comprising:

parametrically oscillating a plurality of pseudo spin pulses, the plurality of pseudo spin pulses being in correspondence with a plurality of Ising model spins in a pseudo manner and having mutually an identical oscillation frequency;

temporarily measuring phases of the plurality of pseudo spin pulses every time the plurality of pseudo spin pulses circularly propagate in a ring resonator to temporarily measure pseudo spins of the plurality of pseudo spin pulses;

temporarily computing sum of interaction between a pseudo spin of a certain pseudo spin pulse and a pseudo spin of all other pseudo spin pulses interacting with the pseudo spin of the certain pseudo spin pulse, based on a coupling coefficient of the Ising model related to the pseudo spin of the certain pseudo spin pulse and the pseudo spins of the other pseudo spin pulses having been temporarily measured every time the plurality of pseudo spin pulses circularly propagate in the ring resonator;

controlling an amplitude and a phase of light injected to the certain pseudo spin pulse every time the plurality of pseudo spin pulses circularly propagate in the ring resonator to temporarily implement a magnitude and a sign of the sum of the interaction between the pseudo spin of the certain pseudo spin pulse and the pseudo spins of all the other pseudo spin pulses interacting with the pseudo spin of the certain pseudo spin pulse, the sum of the interaction having been temporarily computed;

parametrically amplifying the plurality of pseudo spin pulses every time the plurality of pseudo spin pulses circularly propagate in the ring resonator; and measuring the phases of the plurality of pseudo spin pulses after the plurality of pseudo spin pulses have arrived at a steady state in a process of repeating a feedback loop including temporary spin measuring, interaction implementing, and parametric amplifying in this order to measure the pseudo spins of the plurality of pseudo spin pulses.

9. An Ising model quantum computation method comprising:

parametrically oscillating a plurality of pseudo spin pulses, the plurality of pseudo spin pulses being in correspondence with a plurality of Ising model spins in a pseudo manner and having mutually an identical oscillation frequency;

temporarily measuring phases of the plurality of pseudo spin pulses every time the plurality of pseudo spin pulses circularly propagate in a ring resonator to temporarily measure pseudo spins of the plurality of pseudo spin pulses;

temporarily computing sum of interaction between a pseudo spin of a certain pseudo spin pulse and a pseudo spin of all other pseudo spin pulses interacting with the pseudo spin of the certain pseudo spin pulse, based on a coupling coefficient of the Ising model related to the pseudo spin of the certain pseudo spin pulse and the pseudo spins of the other pseudo spin pulses having been temporarily measured every time the plurality of pseudo spin pulses circularly propagate in the ring resonator;

parametrically amplifying the plurality of pseudo spin pulses every time the plurality of pseudo spin pulses circularly propagate in the ring resonator;

controlling an amplitude and a phase of light injected to the certain pseudo spin pulse every time the plurality of pseudo spin pulses circularly propagate in the ring resonator to temporarily implement a magnitude and a sign of the sum of the interaction between the pseudo spin of the certain pseudo spin pulse and the pseudo spins of all the other pseudo spin pulses interacting with the pseudo spin of the certain pseudo spin pulse, the sum of the interaction having been temporarily computed; and measuring the phases of the plurality of pseudo spin pulses after the plurality of pseudo spin pulses have arrived at a steady state in a process of repeating a feedback loop including temporary spin measuring, parametric amplifying, and interaction implementing in this order to measure the pseudo spins of the plurality of pseudo spin pulses.

10. The Ising model quantum computation device according to claim 2, wherein the parametric oscillator parametrically oscillates a plurality of local oscillation pulses having an oscillation frequencies identical to the oscillation frequencies of the plurality of pseudo spin pulses, the plurality of local oscillation pulses pairing with the plurality of pseudo spin pulses one-on-one, the ring resonator in which the plurality of local oscillation pulses circularly propagate, the Ising model quantum computation device further includes a phase modulator that equalizes phases of the plurality of local oscillation pulses from a state including both positive phases and negative phases to a state including one of positive phases and negative phases, the temporary pulse detector performs homodyne detection for a part of the plurality of pseudo spin pulses by using a part of the plurality of local oscillation pulses that pair with the plurality of pseudo spin pulses one-on-one, the pulse injector injects local oscillation pulses that pair with the certain pseudo spin pulses one-on-one and the part of which have the controlled amplitudes and phases, to the certain pseudo spin pulses, and the pseudo pulse detector performs homodyne detection for a part of the plurality of pseudo spin pulses by using a part of the plurality of local oscillation pulses that pair with the plurality of pseudo spin pulses one-on-one.

11. The Ising model quantum computation device according to claim 2, further comprising:

a pulse generator that generates a local oscillation pulse having an angular frequency $\omega$; and a second harmonic generator that generates a pulse having an angular frequency $2\omega$ by using the local oscillation pulse having the angular frequency $\omega$, wherein the parametric oscillator parametrically oscillates the plurality of pseudo spin pulses by using the pulse having the angular frequency $2\omega$, the temporary pulse detector performs homodyne detection for a part of the plurality of pseudo spin pulses by using the local oscillation pulse having the angular frequency $\omega$, the pulse injector injects the local oscillation pulse having the angular frequency $\omega$ with a controlled amplitude and phase, to the certain pseudo spin pulse, and the pseudo pulse detector performs homodyne detection for a part of the plurality of pseudo spin pulses by using the local oscillation pulse having the angular frequency $\omega$.

12. The Ising model quantum computation device according to claim 2, wherein the pulse injector controls the amplitude of light injected to the certain pseudo spin pulse larger at an initial stage of a computation process and smaller at a terminal stage of the computation process.

13. The Ising model quantum computation device according to claim 2, further comprising a temporary amplitude detector that temporarily measures amplitudes of the plurality of pseudo spin pulses every time the plurality of pseudo spin pulses circularly propagate in the ring resonator, wherein the parametric oscillator performs feedback control for amplitude of a pump pulse used for parametric oscillation such that the amplitudes of the plurality of pseudo spin pulses become equal based on the amplitudes of the plurality of pseudo spin pulses having been measured by the temporary amplitude detector.

14. An Ising model quantum parallel computation device comprising:

n-th Ising model quantum computation device according to claim 2 where n-th group (n is an integer equal to or more than one) of pseudo spin pulses in correspondence with n-th group of spins in a pseudo manner among the plurality of Ising model spins circularly propagate in the ring resonator; and a temporary spin sharing circuit that shares information of pseudo spins of the n-th group of pseudo spin pulses among the Ising model quantum computation devices included in parallel, the n-th group of pseudo spin pulses having been temporarily measured by the temporary pulse detector in the n-th Ising model quantum computation device.

15. The Ising model quantum computation device according to claim 3, wherein the pulse injector controls the amplitude of light injected to the certain pseudo spin pulse larger at an initial stage of a computation process and smaller at a terminal stage of the computation process.

16. The Ising model quantum computation device according to claim 3, further comprising a temporary amplitude detector that temporarily measures amplitudes of the plurality of pseudo spin pulses every time the plurality of pseudo spin pulses circularly propagate in the ring resonator, wherein the parametric oscillator performs feedback control for amplitude of a pump pulse used for parametric oscillation such that the amplitudes of the plurality of pseudo spin pulses become equal based on the amplitudes of the plurality of pseudo spin pulses having been measured by the temporary amplitude detector.

17. An Ising model quantum parallel computation device comprising:

n-th Ising model quantum computation device according to claim 3 where n-th group (n is an integer equal to or more than one) of pseudo spin pulses in correspondence with n-th group of spins in a pseudo manner among the plurality of Ising model spins circularly propagate in the ring resonator; and a temporary spin sharing circuit that shares information of pseudo spins of the n-th group of pseudo spin pulses among the Ising model quantum computation devices included in parallel, the n-th group of pseudo spin pulses having been temporarily measured by the temporary pulse detector in the n-th Ising model quantum computation device.

18. The Ising model quantum computation device according to claim 4, wherein
the pulse injector controls the amplitude of light injected to the certain pseudo spin pulse larger at an initial stage of a computation process and smaller at a terminal stage of the computation process.

19. The Ising model quantum computation device according to claim 4, further comprising
a temporary amplitude detector that temporarily measures amplitudes of the plurality of pseudo spin pulses every time the plurality of pseudo spin pulses circularly propagate in the ring resonator, wherein
the parametric oscillator performs feedback control for amplitude of a pump pulse used for parametric oscillation such that the amplitudes of the plurality of pseudo spin pulses become equal based on the amplitudes of the plurality of pseudo spin pulses having been measured by the temporary amplitude detector.

20. An Ising model quantum parallel computation device comprising:
n-th Ising model quantum computation device according to claim 4 where n-th group (n is an integer equal to or more than one) of pseudo spin pulses in correspondence with n-th group of spins in a pseudo manner among the plurality of Ising model spins circularly propagate in the ring resonator; and
a temporary spin sharing circuit that shares information of pseudo spins of the n-th group of pseudo spin pulses among the Ising model quantum computation devices included in parallel, the n-th group of pseudo spin pulses having been temporarily measured by the temporary pulse detector in the n-th Ising model quantum computation device.

* * * * *